(12) United States Patent
Bradley

(10) Patent No.: US 12,339,304 B2
(45) Date of Patent: Jun. 24, 2025

(54) DEVICE FOR THE DETECTION OF HARMFUL ELECTROMAGNETIC FIELDS

(71) Applicant: Arthur Thomas Bradley, Yorktown, VA (US)

(72) Inventor: Arthur Thomas Bradley, Yorktown, VA (US)

(73) Assignee: Faraday Defense Corporation, Kalamazoo, MI (US)

( * ) Notice: Subject to any disclaimer, the term of this patent is extended or adjusted under 35 U.S.C. 154(b) by 196 days.

(21) Appl. No.: 18/174,609

(22) Filed: Feb. 25, 2023

(65) Prior Publication Data

US 2023/0236231 A1 Jul. 27, 2023

Related U.S. Application Data

(63) Continuation-in-part of application No. 17/871,913, filed on Jul. 23, 2022.

(60) Provisional application No. 63/302,730, filed on Jan. 25, 2022.

(51) Int. Cl.
*G01N 27/00* (2006.01)
*G01R 29/08* (2006.01)

(52) U.S. Cl.
CPC ..... *G01R 29/0857* (2013.01); *G01R 29/0871* (2013.01); *G01R 29/0878* (2013.01)

(58) Field of Classification Search
CPC ............ G01R 29/0814; G01R 29/0857; G01R 29/0871; G01R 29/0878
See application file for complete search history.

(56) References Cited

U.S. PATENT DOCUMENTS

| | | | |
|---|---|---|---|
| 10,928,497 B2* | 2/2021 | Kim | G01S 13/0209 |
| 2005/0104768 A1* | 5/2005 | Johnston | G01R 29/0814 |
| | | | 324/76.19 |
| 2009/0006011 A1* | 1/2009 | Kazawa | G01R 29/10 |
| | | | 702/57 |
| 2011/0092181 A1* | 4/2011 | Jackson | G01R 29/0814 |
| | | | 455/341 |
| 2019/0107566 A1* | 4/2019 | Lachica | G01R 29/0892 |

(Continued)

OTHER PUBLICATIONS

Review of Occupational Safety and Health Aspects of Electro-Magnetic Pulse Exposure. Lovelace Biomedical and Environmental Research Institute, 24 pages, Feb. 1977.

*Primary Examiner* — Thang X Le
(74) *Attorney, Agent, or Firm* — Patents and Licensing LLC; Daniel W Juffernbruch

(57) ABSTRACT

The present invention is directed at an electromagnetic weapon event detection device configured to continuously monitor properties of ambient electromagnetic fields harmful to humans. Monitored properties may include real-time electromagnetic field strength, peak electromagnetic field strength in a time period, electromagnetic field exceedance, and cumulative electromagnetic field dose. The device detects powerful microwave and millimeter wave electromagnetic emissions. The device may be integrated into a variety of products, including, but not limited to, a keychain attachment, lanyard attachment, eyeglasses frame, handheld instrument, identification card, writing instrument, or USB dongle. The device may be powered by internal dc power sources, external dc power sources, or energy harvesting.

11 Claims, 26 Drawing Sheets

(56) References Cited

U.S. PATENT DOCUMENTS

2023/0132787 A1* 5/2023 Baxley .................... G01S 7/292
342/195

* cited by examiner

DEVICE FOR THE DETECTION OF HARMFUL ELECTROMAGNETIC FIELDS

CROSS-REFERENCE TO RELATED APPLICATIONS

This application is a Continuation-in-part of, and claims the benefit of, U.S. Non-provisional patent application Ser. No. 17/871,913, filed on Jul. 23, 2023, which claims the benefit of U.S. provisional patent application No. 63/302,730, filed on Jan. 25, 2022, the contents of which are incorporated by reference in their entirety.

BACKGROUND

Field of the Invention

The present invention relates generally to portable devices that detect the presence of electromagnetic fields, and in particular to an electromagnetic field detection device that detects electromagnetic fields that may be harmful to humans or society's technology-dependent infrastructures.

Scope of the Prior Art

The present invention relates to the detection of electromagnetic fields (EMFs) that may be harmful to humans or society's technology-dependent infrastructures. Damaging fields may be intentional, such as those resulting from electromagnetic pulse (EMP) attacks or the use of microwave (1-30 GHz) or millimeter wave (30-300 GHz) weapons. Or they may be unintentional, such as electromagnetic emissions resulting from faulty telecommunications, industrial, or military machinery.

Electromagnetic fields between 1 GHz and 300 GHz with power densities of at least 10,000 watts per square meter are considered potentially harmful to humans. The U.S. military's Active Denial System is an example of a non-lethal electromagnetic weapon operating in the 1 GHz-300 GHz region. Additionally, it is believed that medical symptoms, such as those experienced by government officials in Havana, Cuba, during 2016-2017, may have been the result of bad actors using microwave or millimeter wave weapons. As such, the present invention is capable of measuring microwave and millimeter wave (i.e., 1 GHZ-300 GHz) energy of at least 10,000 watts per square meter.

Additionally, EMPs from directed weapons, e-bombs, and high-altitude nuclear detonations can cause extensive damage to society's infrastructures, including, but not limited to, electrical power distribution, communications, government operations, emergency services, and transportation. Most directed EMP weapons use pulsed microwave energy and are typically used for disrupting or damaging technologies at a single facility, perhaps a communications center. Whereas e-bombs generate powerful broadband pulses of electromagnetic energy by detonating at specific altitudes to disrupt electronics across a localized area, perhaps an enemy military base. Finally, high-altitude nuclear EMP attacks are detonated hundreds of miles above the surface of the earth, resulting in powerful broadband electromagnetic disturbances felt across vast regions, perhaps over an entire continent.

The three components of electromagnetic fields resulting from a high-altitude nuclear EMP are outlined below:

Early time component (E1), pulse duration of approximately 10-20 nanoseconds, peak electric field of up to 100,000 volts per meter;

Intermediate time component (E2), pulse duration from 1 microsecond to 10 milliseconds, peak electric field on the order of 100 volts/meter;

Late time component (E3), pulse duration from one second to hundreds of seconds, peak electric fields on the order of 10-100 volts/kilometer.

As such, the present invention is capable of detecting electromagnetic pulses with peak electric fields of 100 volts per meter to 100,000 volts per meter and pulse durations of 10 nanoseconds to 10 milliseconds. These capabilities correspond to the early time (E1) and intermediate time (E2) components of a high-altitude nuclear EMP. Additionally, the present invention is capable of detecting broadband pulsed microwave electromagnetic energy associated with EMPs resulting from directed weapons and e-bombs.

The present invention differs from existing EMP detection devices in several ways. Unlike corded systems, it is incorporated into a portable housing, such as an identification card, luggage tag, keychain, eyeglasses frame, writing instrument, USB dongle, or small handheld instrument. As such, many preferred embodiments are completely self-powered, requiring no connection to an external power source to operate. Further, the present invention does not monitor a power feed for conductive disturbances, instead focusing exclusively on measuring the ambient environment for radiated electromagnetic disturbances. The present invention also does not rely on either a microprocessor or associated detection software for EMP detection. Rather, it uses analog circuitry to detect the electromagnetic disturbances associated with all three types of EMPs, including the pulsed microwave energy of directed EMP weapons, the broadband electromagnetic pulses from e-bombs, and the early time (E1) and intermediate time (E2) components of a high-altitude nuclear EMP. The use of analog pulse detection hardware greatly reduces the cost, complexity, and power consumption of the detection device. Finally, the present invention does not require user activation. Rather, the device is autonomous, automatically warning the user when in the presence of potentially damaging microwave, millimeter wave, or electromagnetic pulse energy. Together, these benefits enable continuous monitoring of the ambient environment for the occurrence of an EMP.

Likewise, the present invention differs from existing EMF measuring devices, which measure the ambient electromagnetic environment and display the magnitude of the electric and magnetic field levels. Some devices measure low-frequency emissions, such as those associated with electrical power distribution, while others measure radio frequency (RF) emissions, such as those used in wireless communications. Commercially available EMF measuring devices, however, do not have the dynamic range or frequency bandwidth to measure harmful microwave or millimeter wave electromagnetic fields, nor do they accurately detect pulsed electromagnetic fields. Additionally, existing cordless EMF measuring devices must be cycled off when not in use to extend the lifetime of their batteries. This prevents continuous real-time monitoring for potentially harmful electromagnetic fields.

Therefore, what is clearly needed is a portable device, i.e., one able to be incorporated into a portable housing, such as an identification card, luggage tag, keychain, eyeglasses frame, writing instrument, USB dongle, or small handheld instrument, capable of continuously monitoring the ambient environment for potentially harmful or disruptive electromagnetic fields. The device would incorporate ultra low power (ULP) detection and indicator electronics to enable continuous monitoring without the need for frequent battery changes.

Additionally, the device could operate in at least one of three different power configurations. First, it could draw its operating power from an external dc power source, such as through a USB port on a laptop, a cellular phone power bank, an inductive charger, or an automobile's auxiliary receptacle. A second option is for it to have its own internal dc power source, such as a battery, which may or may not be rechargeable. If rechargeable, the device could also be recharged by a wired connection to an external dc power source, such as USB port. Finally, it could recharge via energy harvesting, such as otherwise wasted energy recovered from sources, including solar, thermal, wind, movement, or electromagnetic fields.

SUMMARY

The present disclosure satisfies the foregoing needs by providing, inter alia, an electromagnetic field detection device for addressing each of the foregoing desirable traits.

The present invention is directed at an electromagnetic field detection device configured to receive ambient electromagnetic energy from an electromagnetic field and to indicate the presence of that field when it meets certain detection criteria. The device detects electromagnetic fields associated with electromagnetic events that may be harmful to humans or cause damage to society's technology-dependent infrastructures.

The device may be powered by an external dc power source; an onboard disposable battery, rechargeable battery, or supercapacitor; or by harvesting ambient electromagnetic or solar energy. In some embodiments, the ambient energy-harvested electromagnetic energy may be received by an antenna. In some embodiments, the energy-harvested ambient solar energy may be received by a solar panel. In some embodiments, properties of the electromagnetic field may be indicated by an indicator. Indicators include visible indicators, audible indicators, tactile indicators, and electrical signals. Properties may include real-time electromagnetic field strength, peak electromagnetic field strength in a time period, electromagnetic field exceedance, and cumulative electromagnetic field dose.

According to the embodiment, the device may be comprised of an antenna to receive potentially harmful or disruptive electromagnetic field energy, a matching network coupled to the antenna, a detector coupled to the matching network and configured to output a signal based on the ambient electromagnetic field received by the antenna, an indicator coupled to the detector and configured to indicate a property of the electromagnetic field, and a dc power module. The detector may be in the form of known detection circuitry, including but not limited to, a peak detector, sample and hold, monostable multivibrator, analog-to-digital converter, latched comparator, latched switch, latched multiplexer, and d-type latch.

According to another embodiment, the device may be comprised of a plurality of channels, each of the channels comprised of an antenna configured to receive ambient electromagnetic field energy, an matching network coupled to the antenna, a detector coupled to the matching network and configured to output a signal based on the ambient electromagnetic energy received by the antenna, and an indicator coupled to the detector and configured to indicate a property of an electromagnetic field. In some embodiments, at least one of the indicators is further coupled to all of the detectors. In some embodiments, each of the antennas is configured to receive a same frequency or frequency range of the ambient electromagnetic energy. In some embodiments, at least one of the antennas is configured to receive a different frequency or frequency range of the ambient electromagnetic energy.

According to yet another embodiment, the device may be comprised of a first plurality of antennas configured to receive the ambient electromagnetic energy of the electromagnetic field, a second plurality of matching networks, each of the matching networks coupled to at least one of the antennas, a third plurality of detectors, each of the detectors coupled to at least one of the matching networks and configured to output a signal based on the ambient electromagnetic energy received by at least one of the antennas, and a fourth plurality of indicators, each of the indicators coupled to at least one of the detectors and configured to indicate the property of the electromagnetic field. In some embodiments, at least one of the indicators is further coupled to of all the detectors. In some embodiments, at least one of the antennas is configured to receive a different frequency or frequency range of the ambient electromagnetic energy. In some embodiments, at least one of the indicators is coupled differentially to at least two of the detectors.

The present invention can be used to continuously monitor properties of an electromagnetic field in nearly any environment without intervention by the operator, and in many embodiments, without the need for receptacle power. Indicators reflect numerous electromagnetic field properties, including, but not limited to, real-time electromagnetic field strength, peak electromagnetic field strength in a time period, electromagnetic field exceedance, and cumulative electromagnetic field dose.

BRIEF DESCRIPTION OF THE DRAWINGS

The foregoing summary, as well as the following detailed description of preferred variations of the invention, will be better understood when read in conjunction with the appended drawings. For the purpose of illustrating the invention, there is shown in the drawings variations that are presently preferred. It should be understood, however, that the invention is not limited to the precise arrangements shown. In the drawings, where.

DETAILED DESCRIPTION

Implementations of the present technology will now be described in detail with reference to the drawings, which are provided as illustrative examples so as to enable those skilled in the art to practice the technology. Notably, the figures and examples below are not meant to limit the scope of the present disclosure to any single implementation or implementations. Wherever convenient, the same reference numbers will be used throughout the drawings to refer to same or like parts.

Moreover, while variations described herein are primarily discussed in the context harvesting ambient electromagnetic energy, it will be recognized by those of ordinary skill that the present disclosure is not so limited. In fact, the principles of the present disclosure described herein may be readily applied to energy harvesting in general, a term describing a process by which otherwise wasted energy, such as that from solar, thermal, wind, movement, or electromagnetic fields, is converted to usable energy.

In the present specification, an implementation showing a singular component should not be considered limiting; rather, the disclosure is intended to encompass other implementations including a plurality of the same component, and vice-versa, unless explicitly stated otherwise herein. Further, the present disclosure encompasses present and future known equivalents to the components referred to herein by way of illustration.

It will be recognized that while certain aspects of the technology are described in terms of a specific sequence of steps of a method, these descriptions are only illustrative of the broader methods of the disclosure and may be modified as required by the particular application. Certain steps may be rendered unnecessary or optional under certain circumstances. Additionally, certain steps or functionality may be added to the disclosed implementations, or the order of performance of two or more steps permuted. All such variations are considered to be encompassed within the disclosure disclosed and claimed herein.

Figure 1:
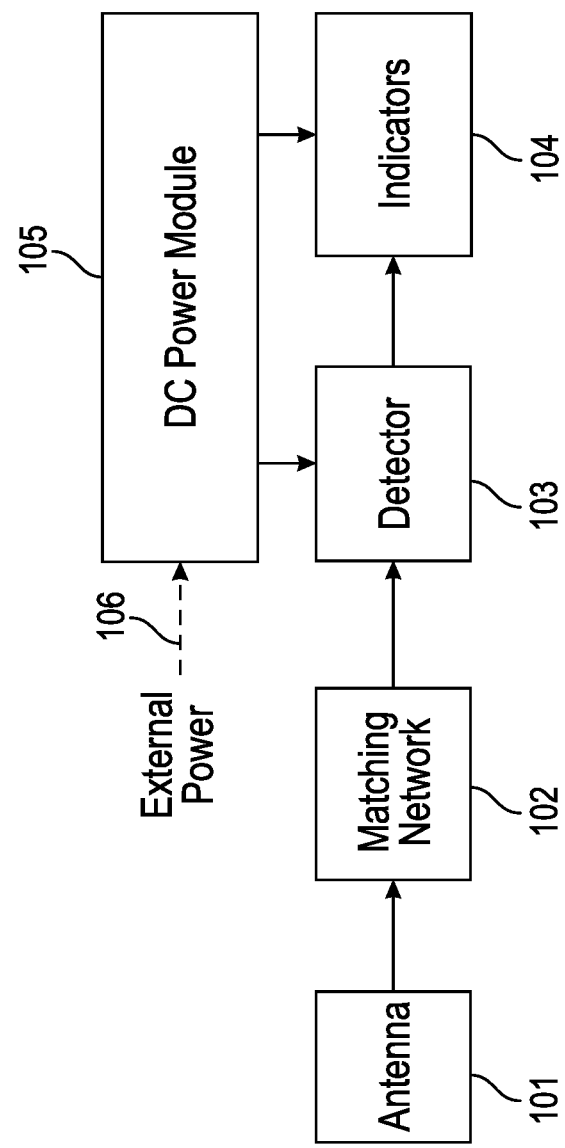
FIG. 1 is a block diagram illustrating example physical components of an electromagnetic field detection device, according to an embodiment.

FIG. 1 is a block diagram illustrating example physical components (e.g., hardware) of an electromagnetic field detection device, according to an embodiment. The electromagnetic field detection device may comprise an antenna 101, a matching network 102, a detector 103, a dc power module 105, one or more indicators 104, and an optional connection for an external power source 106.

The dc power module 105 may include any standard electrical component or system known in the art that is able to store and deliver electrical charge, including, but not limited to, a battery, capacitor, or supercapacitor. Additionally, it may include a charge management system, voltage converter, energy conditioning module, and electrical interface by which to attach an external power source to recharge the charge storage components or provide energy to operate the detection device.

The antenna 101 may be any standard device known in the art that is able to receive a time-varying electromagnetic signal in frequency regions that are suspected to be harmful to humans or cause damage to society's infrastructures. These regions include microwave (1-30 GHz), millimeter wave (30-300 GHz), or the early time (E1) or intermediate time (E2) components of an EMP. According to an embodiment, the antenna 101 may be configured to receive one frequency, or a plurality of frequencies (e.g., a multi-band antenna), of ambient electromagnetic energy. Alternatively, the antenna 101 may be configured to receive one frequency range, or a plurality of frequency ranges (e.g., a multi-band antenna), of ambient electromagnetic energy. The antenna 101 may be manufactured into the circuit board assembly, an onboard discrete component, or an offboard discrete component. Further, it may be internal or external to the portable housing.

The matching network 102 may be any standard network known in the art that is able to match the output characteristics (e.g., impedance) of the antenna 101 with the input characteristics (e.g., impedance) of the detector 103 to maximize the power, voltage, or current transferred between said components. According to an embodiment, the matching network 102 may be further configured to attenuate frequencies that are out of the desired detection band. Alternatively, the matching network 102 may be used to set the efficiency of the device, making it more or less sensitive to specific electromagnetic fields. The matching network 102 can also include active gain elements, such as a linear or logarithmic amplifier, to further optimize the amplitude of the signal passed to the detector, improving sensitivity and dynamic range.

The detector 103 may be any standard device known in the art that is able to determine when a time-varying electromagnetic signal exceeds predefined levels. According to an embodiment, the detector output voltage activates one or more indicators 104 that reflect the characteristics of electromagnetic field exposure.

The indicators 104 may be any indicator known in the art that is able to indicate a property of an electromagnetic field based on an inputted analog or digital voltage. According to an embodiment, indicators may be activated by the output voltage of one or more detectors. According to an embodiment, the indicators 104 may be visible, audible, and tactile indicators. Visible indicators may include, but are not limited to, light emitting diodes (e.g., where brightness indicates electromagnetic field strength), light-emitting diode alphanumeric displays, and liquid crystal alphanumeric displays. Audible indicators may include, but are not limited to, audible buzzers (e.g., where volume, tone, or pattern indicate electromagnetic field detection, strength, or total exposure). Tactile indicators may include, but are not limited to vibration buzzers (e.g., where vibration levels indicate electromagnetic field detection, strength, or total exposure). Additionally, according to an embodiment, the indicators 104 may be electrical signals.

Figure 2:
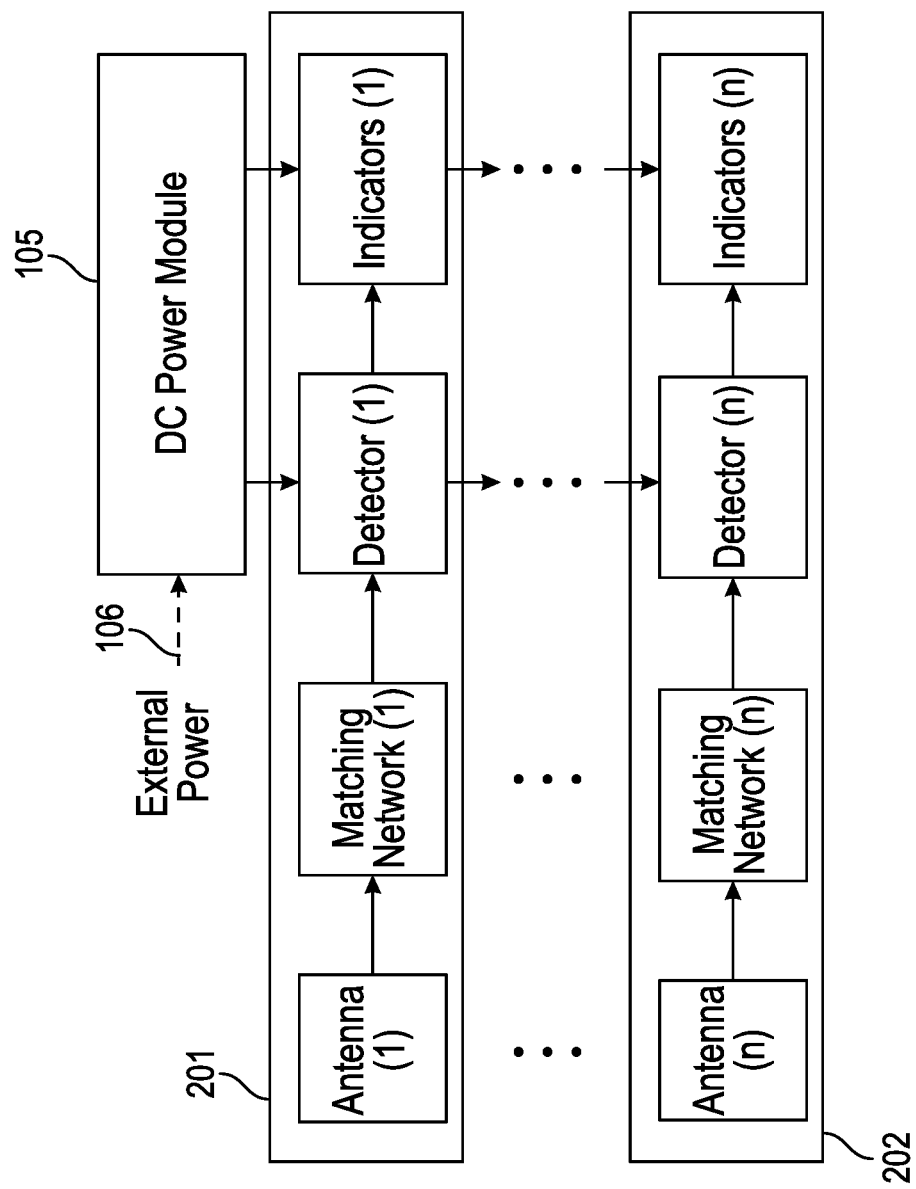
FIG. 2 is a block diagram illustrating example physical components of a multi-channel electromagnetic field detection device, according to an embodiment.

FIG. 2 is a block diagram illustrating example physical components of a multi-channel electromagnetic field detection device, according to an embodiment. The multi-channel electromagnetic field detection device may comprise a dc power module 105 and multiple parallel channels 201 202, each channel comprising an antenna, a matching network, a detector, and one or more indicators.

According to an embodiment, each channel may be configured to operate at a different frequency or frequency range to allow simultaneous monitoring of electromagnetic field levels at multiple frequencies of frequency ranges. Alternatively, two or more channels may be configured to operate at the same frequency or frequency range but may be calibrated to have different sensitivities. This can be done using antennas with different gains, tailoring the matching networks to have different power transfer efficiencies, and using different detector topologies. Additionally, different types of indicators may be used for each channel.

Figure 3:
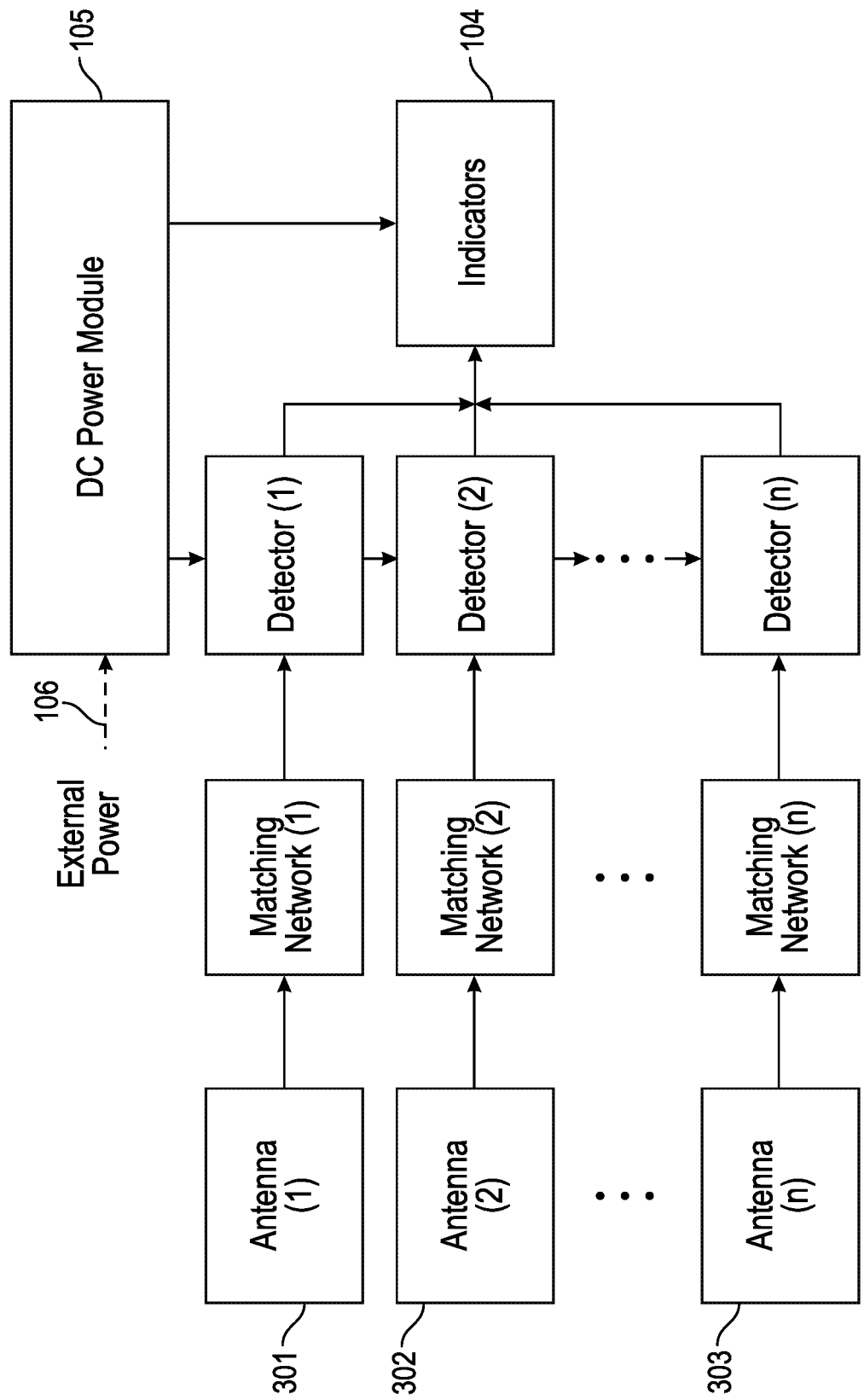
FIG. 3 is a block diagram illustrating example physical components of a multi-feed electromagnetic field detection device, according to an embodiment.

FIG. 3 is a block diagram illustrating example physical components of a multi-feed electromagnetic field detection device, according to an embodiment. The multi-feed electromagnetic field detection device may comprise a dc power module 105 and multiple parallel channels 301 302 303, each channel comprising an antenna, a matching network, and a detector. According to an embodiment, each channel may be configured to operate at a different frequency or frequency range. The device may further comprise one or more indicators 104. According to an embodiment, each of the indicators 104 is coupled with each of the detectors, enabling the channel with the largest detector output to drive the indicators 104. Alternatively, at least one of the indicators 104 is coupled with each of the detectors. Yet alternatively, each of the indicators 104 is coupled to a plurality of the detectors. Yet alternatively, at least one of the indicators 104 is coupled to a plurality of the detectors.

Figure 4:
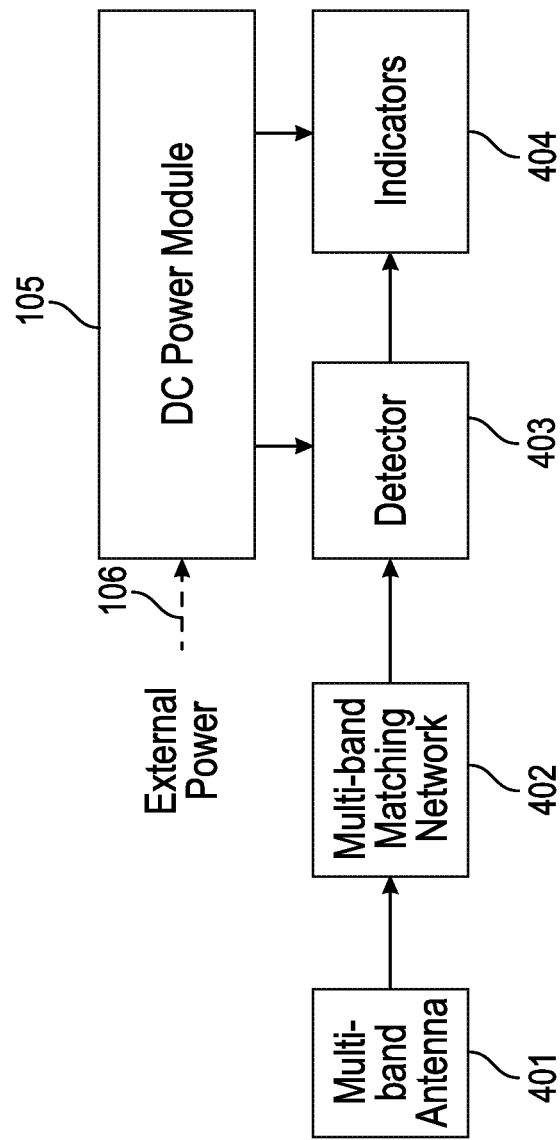
FIG. 4 is a block diagram illustrating example physical components of a multi-band electromagnetic field detection device, according to an embodiment.

FIG. 4 is a block diagram illustrating example physical components of a multi-band electromagnetic field detection device, according to an embodiment. The multi-band electromagnetic field detection device may comprise a dc power module 105, a multi-band antenna 401, a multi-band matching network 402, a detector 403, and indicators 404.

The multiple-band antenna 401 is designed to efficiently receive ambient electromagnetic field energy at multiple frequencies. The multiple-band matching network 402 provides matching at those same frequencies to ensure optimal voltage, current, or power transfer to the detector 403. This multiple-band embodiment has the potential for greater sensitivity due to its ability to collect and sum energy from multiple frequencies or multiple frequency ranges simultaneously.

Figure 5:
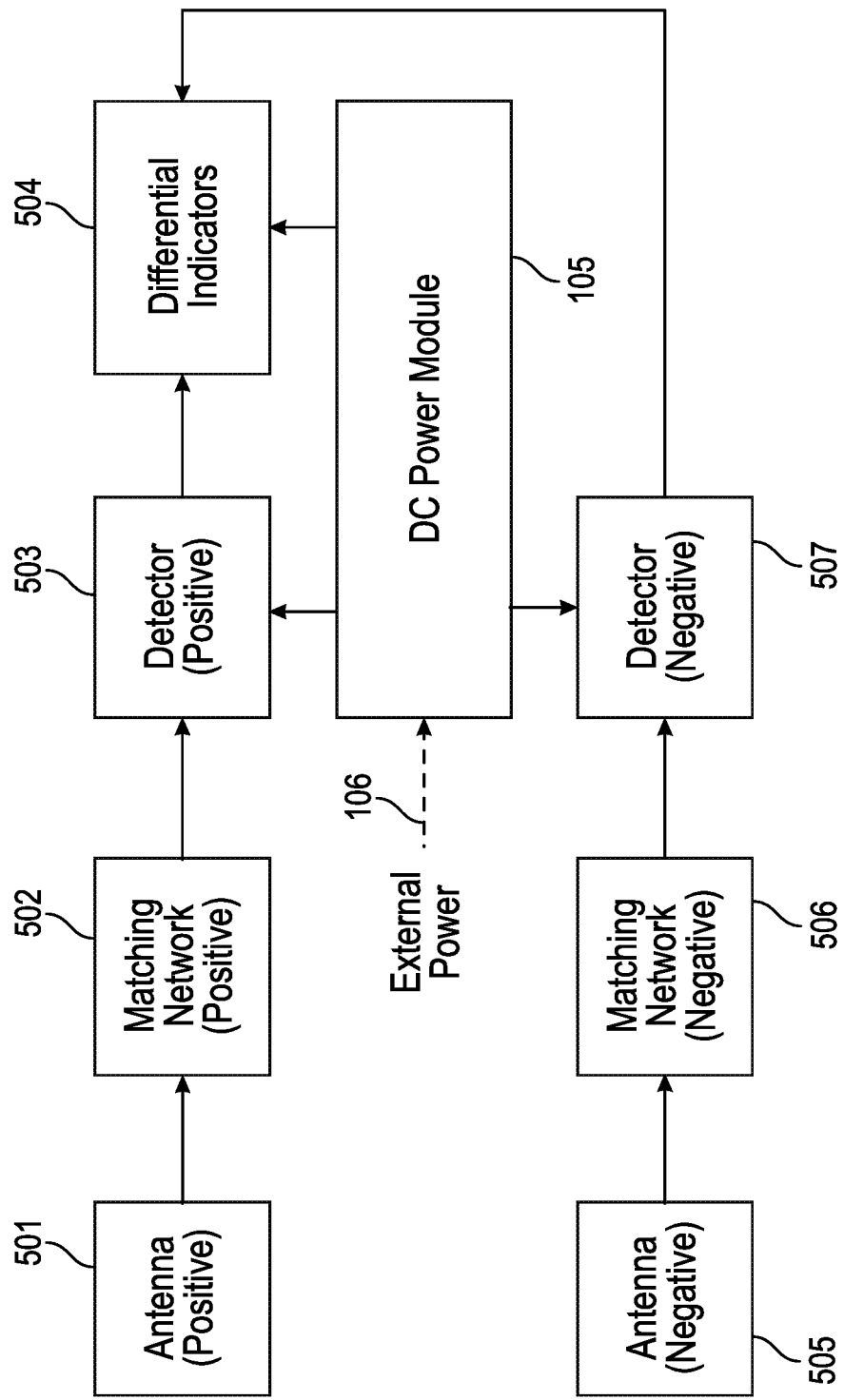
FIG. 5 is a block diagram illustrating example physical components of a differential electromagnetic field detection device, according to an embodiment.

FIG. 5 is a block diagram illustrating example physical components of a differential electromagnetic field detection device, according to an embodiment. The differential electromagnetic field detection device may comprise a dc power module 105, antennas 501 505, matching networks 502 506, a positive detector 503, a negative detector 507, and differential indicators 504.

The positive detector 503 may output a positive driving signal to the differential indicators 504 while the negative detector 507 may output a negative driving signal to the differential indicators 504. The opposite is also true. Together, the two detectors 503 507 differentially drive the indicators 504, resulting in a greater driving voltage, and, thus, increased electromagnetic field monitoring sensitivity.

Figure 6:
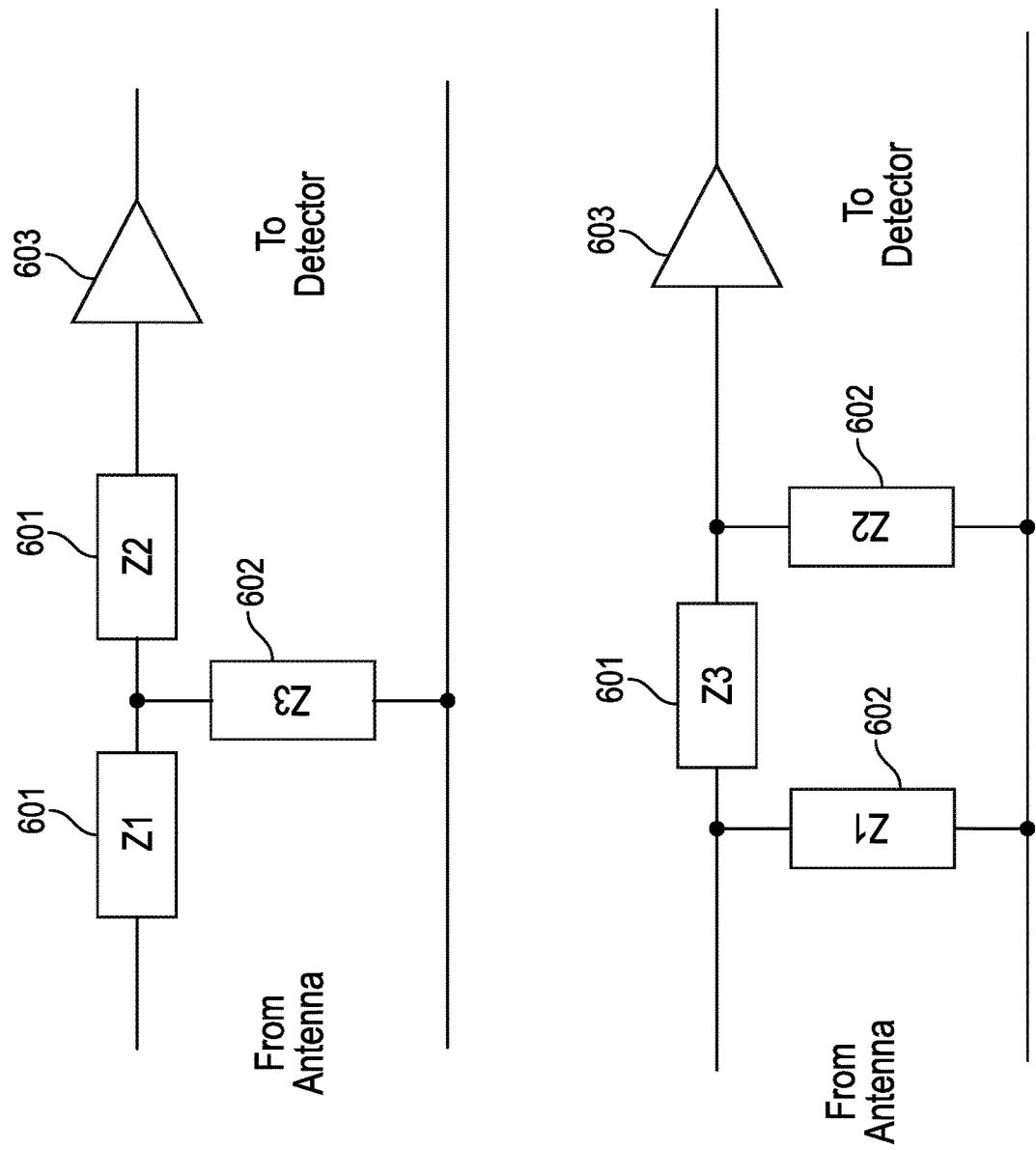
FIG. 6 is a schematic diagram illustrating an example "T" and "π" implementations of a matching network, according to an embodiment.

FIG. 6 is a schematic diagram illustrating example "T" and "π" implementations of a matching network, according to an embodiment. Both implementations may comprise series elements 601 and a shunt elements 602, where each element is one or more resistors, inductors, or capacitors. In this configuration, one or more elements may also be excluded. Additionally, more complex matching networks are possible, including those with active gain elements, such as linear and logarithmic amplifiers 603. The matching network 102 matches the output characteristics of the antenna 101 to the input characteristics of the detector 103. This ensures that optimal voltage, current, or power is transferred between the two, resulting in greater measurement sensitivity without oversaturation. The matching network 102 also filters out frequencies that are outside of the desired monitoring band, ensuring that the device responds most efficiently to frequencies of interest.

Figure 7:
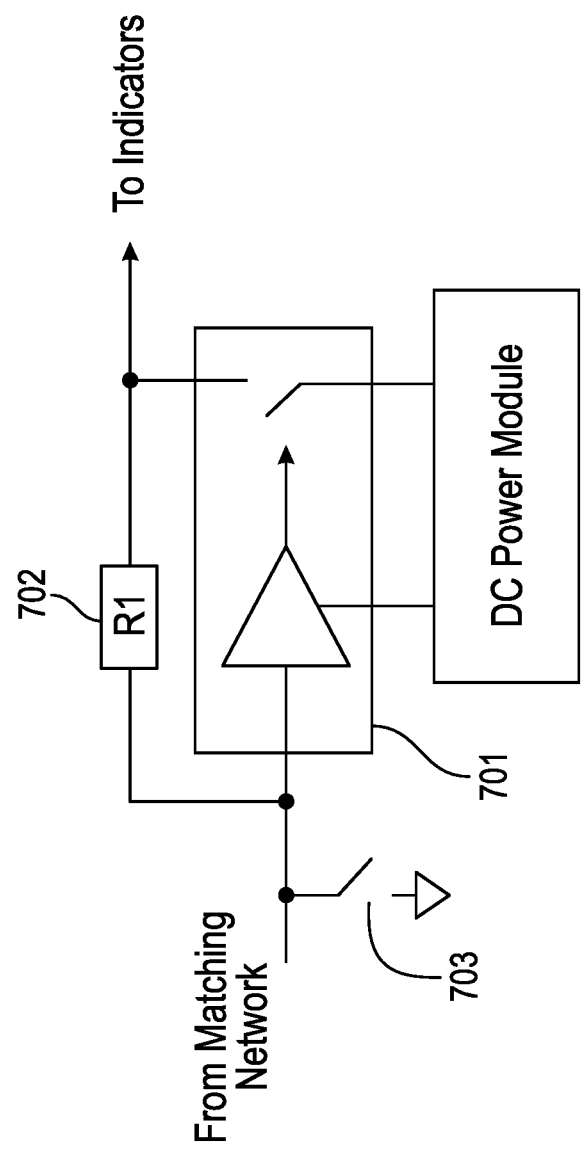
FIG. 7 is a schematic diagram illustrating an example latched multiplexer topology, according to an embodiment.

FIG. 7 is a schematic diagram illustrating an example latched multiplexer topology, according to an embodiment. The latched multiplexer detector topology may comprise a multiplexer 701, a feedback element 702, and a reset switch 703. When the signal from the matching network exceeds the turn-on voltage of the multiplexer 701, the multiplexer switches the DC Power Module 105 voltage out to the indicators. The dc voltage is also fed back to the input of the multiplexer, latching the output of the multiplexer in the detected state. Reset switch 703 is used to reset the multiplexer 701 by zeroing out its input. The latched multiplexer topology is a specific embodiment of a latched switch topology.

Figure 8:
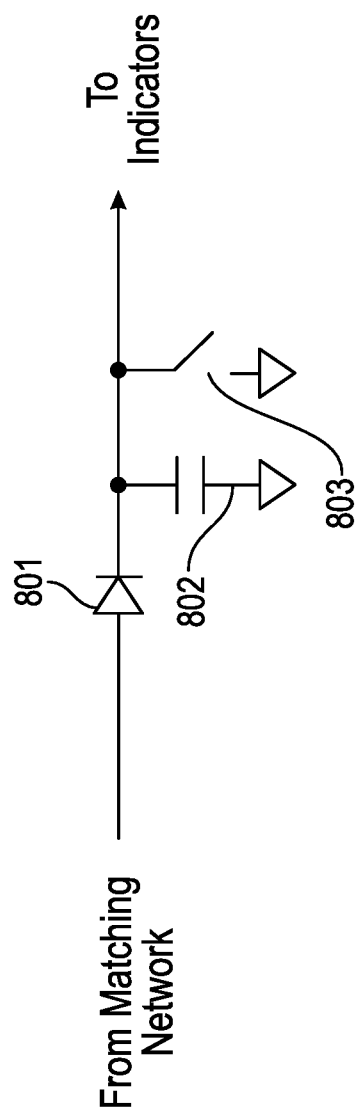
FIG. 8 is a schematic diagram illustrating an example single-diode peak detector topology, according to an embodiment.

FIG. 8 is a schematic diagram illustrating an example single-diode peak detector topology, according to an embodiment. The single diode peak detector topology may comprise a diode 801, a capacitor 802, and a reset switch

803. The diode 801 passes the signal received from the matching network 102 to charge the capacitor 802. The diode 801 also prevents the capacitor 802 from discharging when the received signal falls below the voltage of the stored charge. In this manner, the voltage on the capacitor 802 attains the peak value of the received signal, minus the small voltage drop of the diode. When closed, the switch 803 resets the detector by discharging the capacitor.

Figure 9:
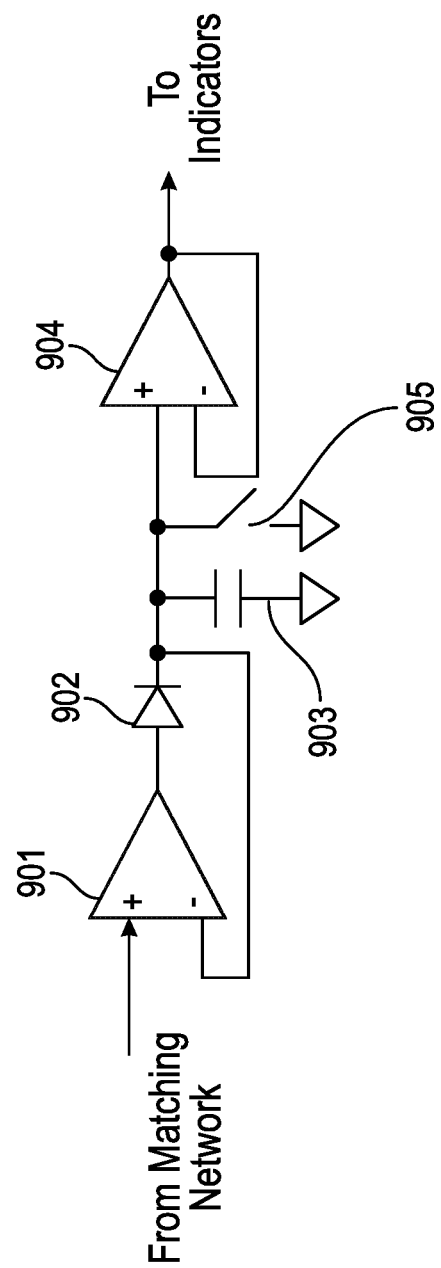
FIG. 9 is a schematic diagram illustrating an example peak detector with op amp feedback loop topology, according to an embodiment.

FIG. 9 is a schematic diagram illustrating an example peak detector with op amp feedback loop topology, according to an embodiment. The op amp feedback loop topology may comprise an input op amp 901, a diode 902, a capacitor 903, a reset switch 905, and an output op amp 904. The input op amp 901 is configured with a feedback loop around the series diode 902 to compensate for the voltage drop across the diode. The diode 902 passes the signal passed from the matching network 102 to charge the capacitor 903. The diode 902 also prevents the capacitor 903 from discharging back into the op amp 901 when the received signal falls below the voltage of the stored charge. In this manner, the voltage on the capacitor 903 attains the peak value of the received signal. The output op amp 904 acts as a buffer while minimizing unwanted discharge of the capacitor 903 and may be excluded. When closed, the switch 905 resets the detector by discharging the capacitor.

Figure 10:
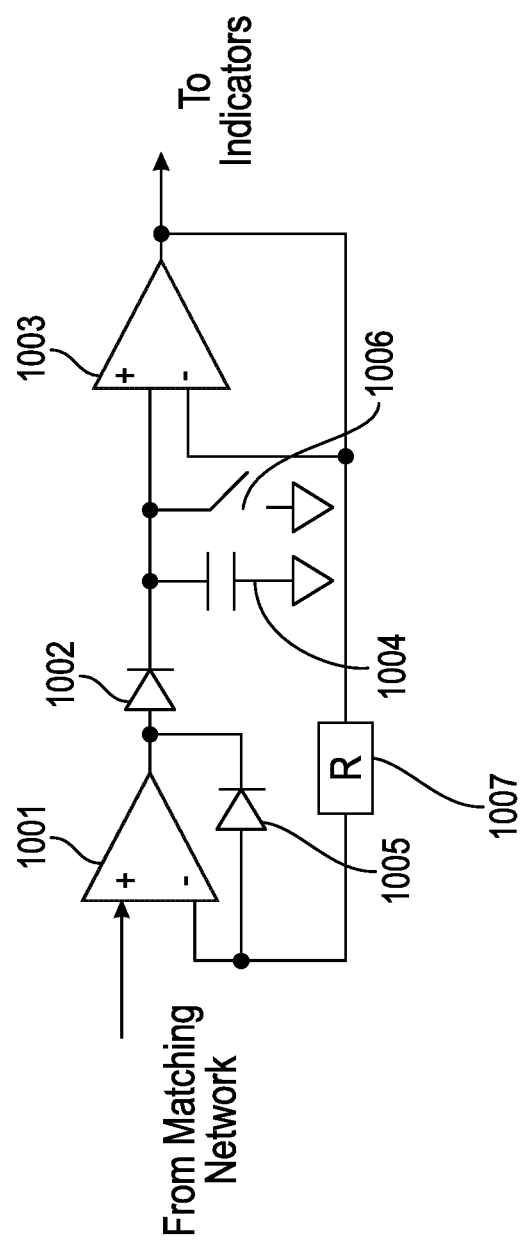
FIG. 10 is a schematic diagram illustrating an example peak detector with reverse saturation limiting feedback topology, according to an embodiment.

FIG. 10 is a schematic diagram illustrating an example peak detector with reverse saturation limiting feedback topology, according to an embodiment. The reverse saturation limiting feedback topology may comprise an input op amp 1001, a series diode 1002, a feedback diode 1005, a capacitor 1004, a feedback resistor 1007, a reset switch 1006, and an output op amp 1003. The input op amp 1001 and series diode 1002 pass the signal from the matching network 102 to charge the capacitor 1004. The series diode 1002 also prevents the capacitor 1004 from discharging back into the input op amp 1001 when the received signal falls below the voltage of the stored charge. In this manner, the voltage on the capacitor 1004 attains the peak value of the received signal. The feedback diode 1005 and feedback resistor 1007 are used to keep the input op amp 1001 below the saturation level during reverse biasing of the series diode 1002. The output op amp 1003 acts as a buffer while minimizing unwanted discharge of the capacitor 1004 and may be excluded. When closed, the switch 1006 resets the detector by discharging the capacitor 1004.

Figure 11:
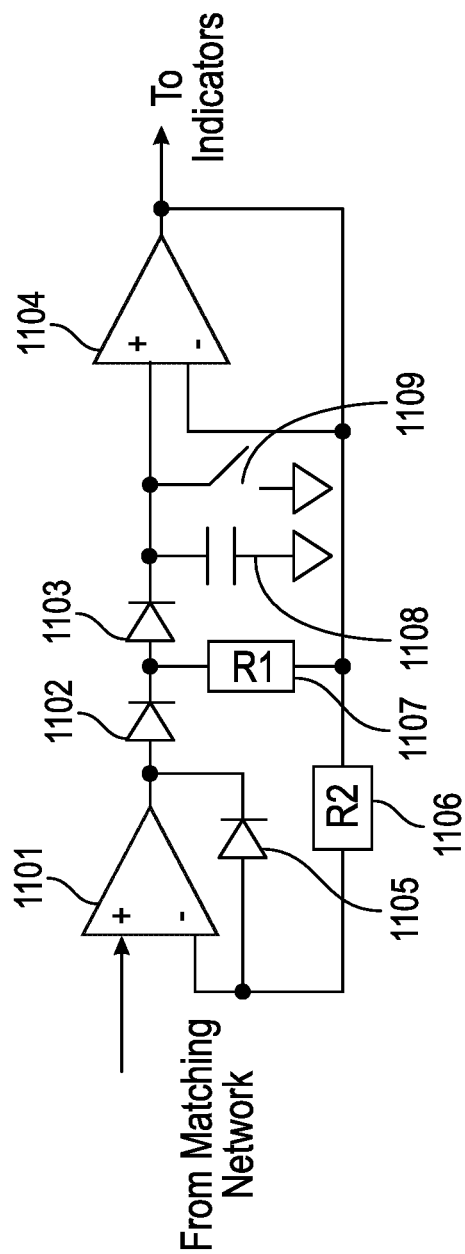
FIG. 11 is a schematic diagram illustrating an example peak detector with bootstrapping topology, according to an embodiment.

FIG. 11 is a schematic diagram illustrating an example peak detector with bootstrapping topology, according to an embodiment. The bootstrapping topology may comprise an input op amp 1101, a blocking diode 1102, a feedback diode 1105, a series diode 1103, a shunt resistor 1107, a capacitor 1108, a feedback resistor 1106, a reset switch 1109, and an output op amp 1104. The input op amp 1101 and series diode 1103 pass the signal passed from the matching network 102 to charge the capacitor 1108. The series diode 1103 also prevents the capacitor 1108 from discharging back into the op amp 1101 or through the shunt resistor 1107 when the received signal falls below the voltage of the stored charge. In this manner, the voltage on the capacitor 1108 attains the peak value of the received signal. The feedback diode 1105 and feedback resistor 1106 are used to keep the input op amp 1101 below the saturation level during reverse biasing of the series diode 1002. The shunt resistor 1107 biases the anode of the series diode 1103 with the output voltage of the op amp 1104 to keep the diode drop to near zero, thus minimizing reverse bias leakage. Diode 1102 blocks the feedback voltage from driving back into the input op amp 1101, reducing unnecessary power consumption. The output op amp 1104 acts as a buffer while minimizing unwanted discharge of the capacitor 1108. When closed, the switch 1109 resets the detector by discharging the capacitor 1108.

Figure 12:
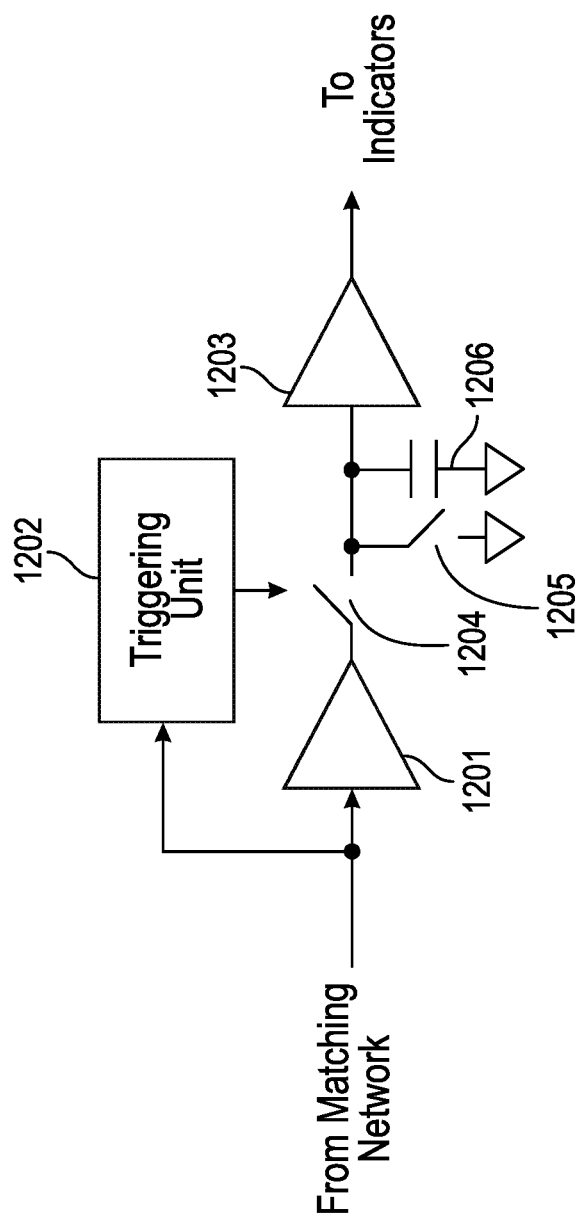
FIG. 12 is a schematic diagram illustrating an example detector with sample and hold topology, according to an embodiment.

FIG. 12 is a schematic diagram illustrating an example detector with sample and hold topology, according to an embodiment. The sample and hold topology may comprise an input op amp 1201, a triggering unit 1202, a switching element 1204, a capacitor 1206, a reset switch 1205, and an output op amp 1203. The signal passed from the matching network is fed to the input op amp 1201 and the triggering unit 1202. When the input level exceeds a predefined peak detection threshold, the triggering unit 1202 activates the switching element 1204 to store the input value on the capacitor 1206. The stored value is then passed to the output op amp 1203, which acts as a buffer while minimizing unwanted discharge of the capacitor 1206. When closed, the switch 1205 resets the detector by discharging the capacitor 1206.

Figure 13:
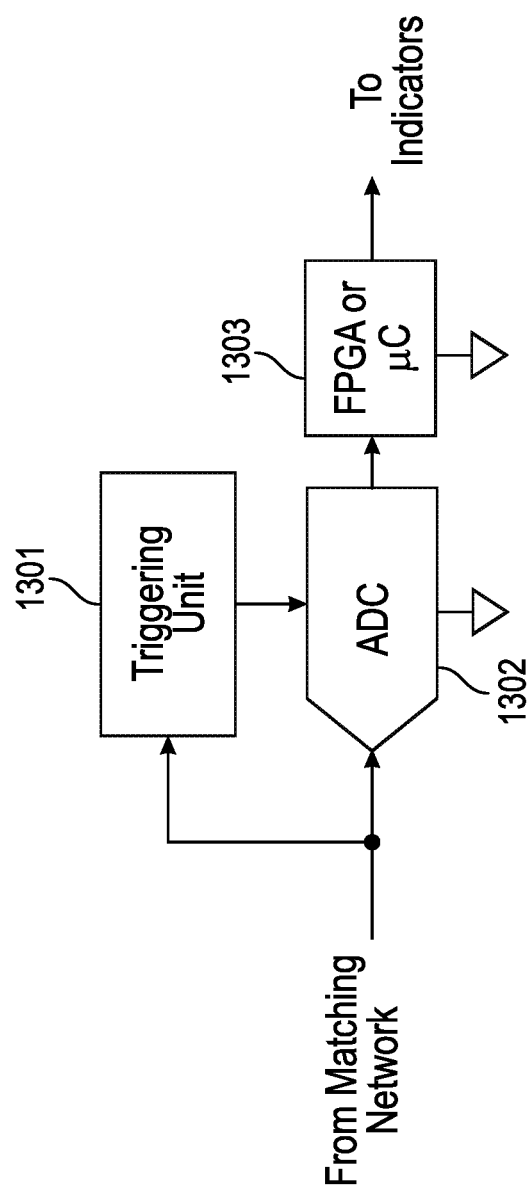
FIG. 13 is a schematic diagram illustrating an example detector with analog-to-digital sampling topology, according to an embodiment.

FIG. 13 is a schematic diagram illustrating an example detector with analog-to-digital sampling topology, according to an embodiment. The analog-to-digital sampling topology may comprise an analog-to-digital converter (ADC) 1302, a triggering unit 1301, and a field programmable gate array (FPGA) or microcontroller (µC) 1303. The signal passed from the matching network is fed to the ADC 1302 and triggering unit 1301. When the input level exceeds a predefined peak detection threshold, the triggering unit 1301 activates the ADC 1302 to convert the received signal from an analog representation to a digital representation. The digitized representation is then fed to the FPGA or µC 1303 for processing. When detection conditions are met, the FPGA or µC 1303 sends a signal to the indicators 104.

Figure 14:
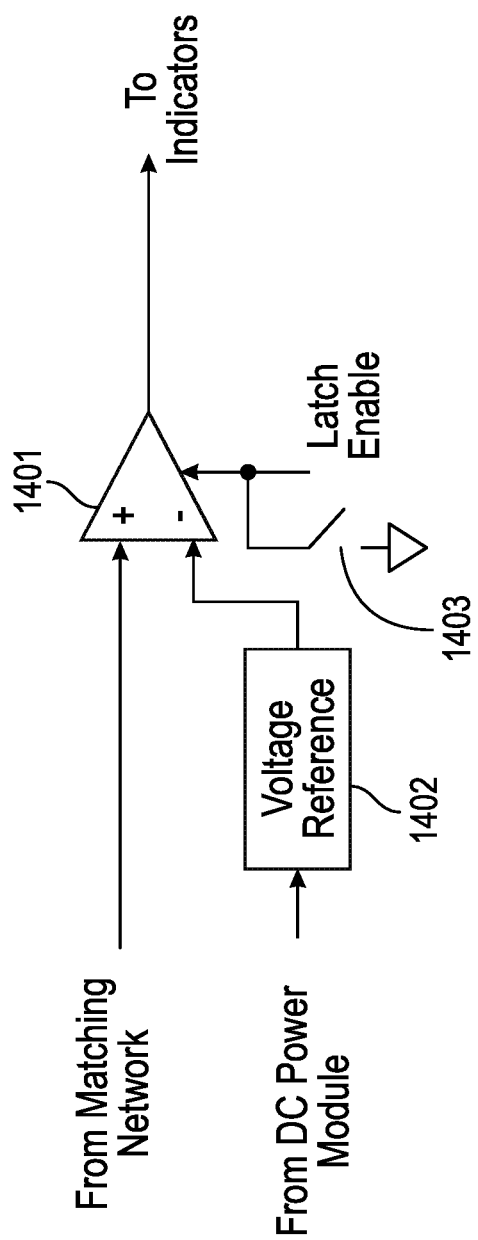
FIG. 14 is a schematic diagram illustrating an example detector with latched comparator topology, according to an embodiment.

FIG. 14 is a schematic diagram illustrating an example detector latched comparator topology, according to an embodiment. The latched comparator topology may comprise a voltage reference 1402, a comparator 1401, and a reset switch 1403. The signal passed from the matching network is fed to the comparator 1401 where it is compared to the value provided by the voltage reference 1402. If the input exceeds the voltage reference value, the comparator 1401 outputs the positive rail voltage to the indicators 104. Likewise, if the voltage reference exceeds the input, the comparator 1401 outputs the negative rail voltage to the indicators 104. A latch enable can be used to reset or disable the latch.

Figure 15:
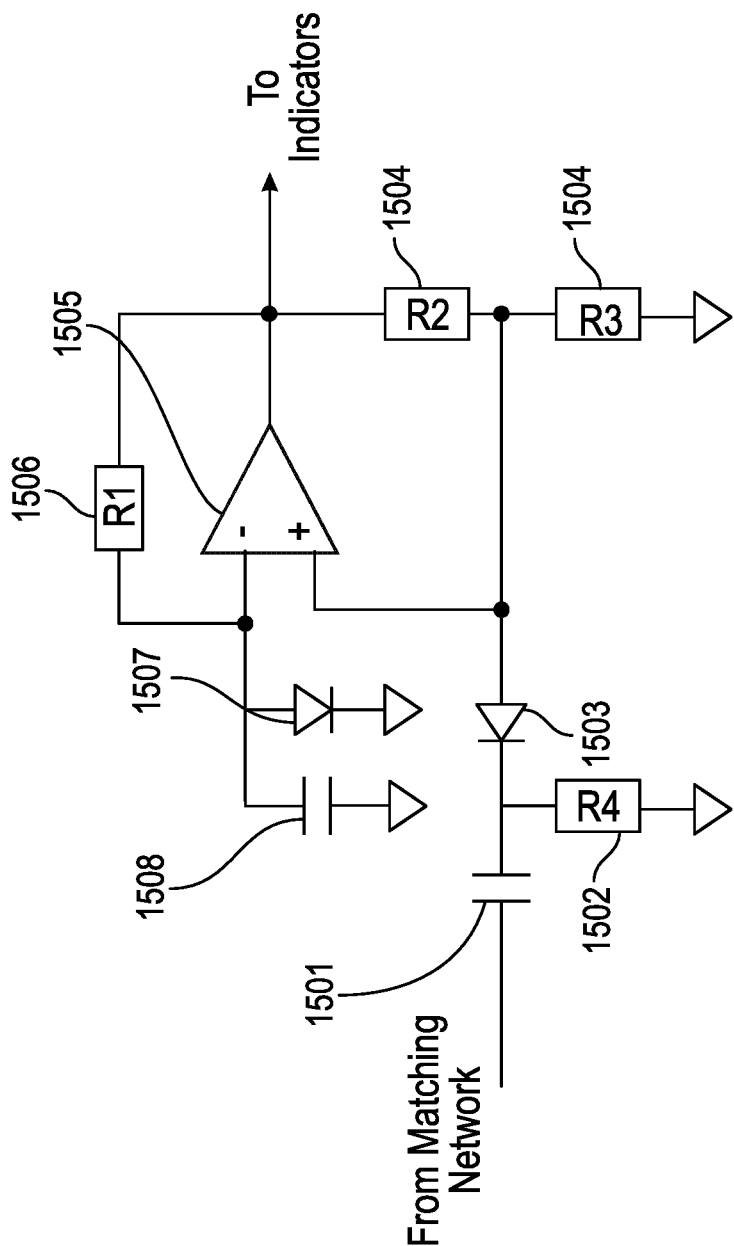
FIG. 15 is a schematic diagram illustrating an example detector with monostable multivibrator topology, according to an embodiment.

FIG. 15 is a schematic diagram illustrating an example detector monostable multivibrator topology, according to an embodiment. The monostable multivibrator topology may comprise a differentiating capacitor 1501, blocking diode 1503, op amp 1505, negative feedback components 1506, 1507, 1508, and positive feedback resistor divider 1504. The signal passed from the matching network is fed to the differentiating capacitor 1501, converting a brief positive step or pulse into a negative impulse that triggers the monostable multivibrator. Before the input step or pulse occurs, diode 1503, resistors 1504, and resistor 1502 set the voltage on the op amp's positive terminal. The op amp's output is driven to the positive saturation voltage. This output voltage is fed to the diode 1507, which turns on and biases the capacitor 1508 at one forward diode drop voltage, keeping the op amp 1505 negative terminal input voltage well below the positive terminal input voltage, thus maintaining a stable op amp output voltage at the positive saturation voltage. Once the differentiating capacitor 1501 converts an input step or pulse to a negative impulse, the impulse acts as a trigger that drives the op amp 1505 positive voltage terminal below the negative terminal voltage, forcing the op amp output to fall to the negative saturation voltage. The diode 1507 turns off, and the capacitor 1508 begins to charge to the negative saturation voltage. When the capacitor 1508 voltage falls below the op amp negative terminal voltage, set by the voltage divider 1504, the op amp output changes back to the positive saturation voltage. The time period that the op amp output remains low is set by the feedback resistor 1506, feedback capacitor 1508, and voltage divider 1504. Working in this way, a pulse or step passed from the matching network 102, causes a controlled-duration pulse to be output from the monostable multivibrator.

Figure 16:
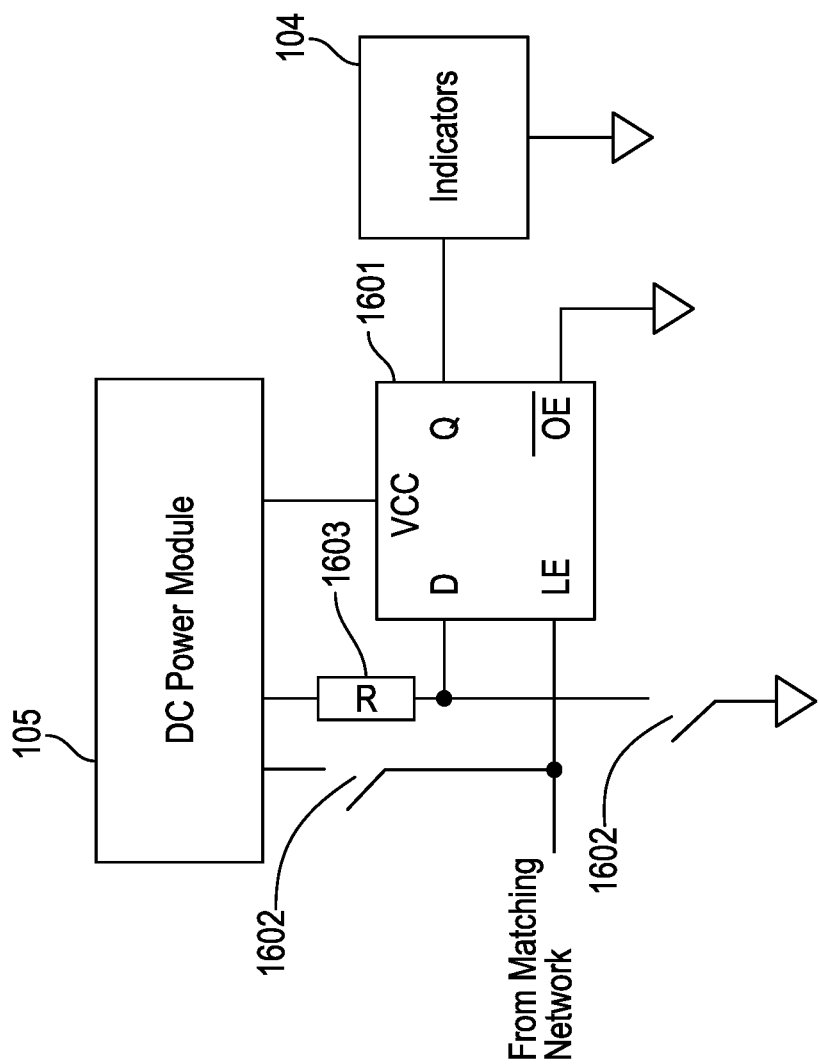
FIG. 16 is a schematic diagram illustrating an example detector with d-type latch topology, according to an embodiment.

FIG. 16 is a schematic diagram illustrating an example detector d-type latch topology, according to an embodiment. The signal from the matching network 102 triggers the latch enable, LE, of the d-type latch 1601. This causes the output Q to latch to the voltage set by the dc power module 105 on the VCC input. The latched output Q is then used to signal the detection of potentially harmful fields, or other information about the ambient electromagnetic environment, to the indicators 104. In this simple embodiment, the d-type latch is reset by switches 1602, which are used to drive the latch enable LE high and the D input low. Other reset techniques are possible, including cycling power.

Figure 17:
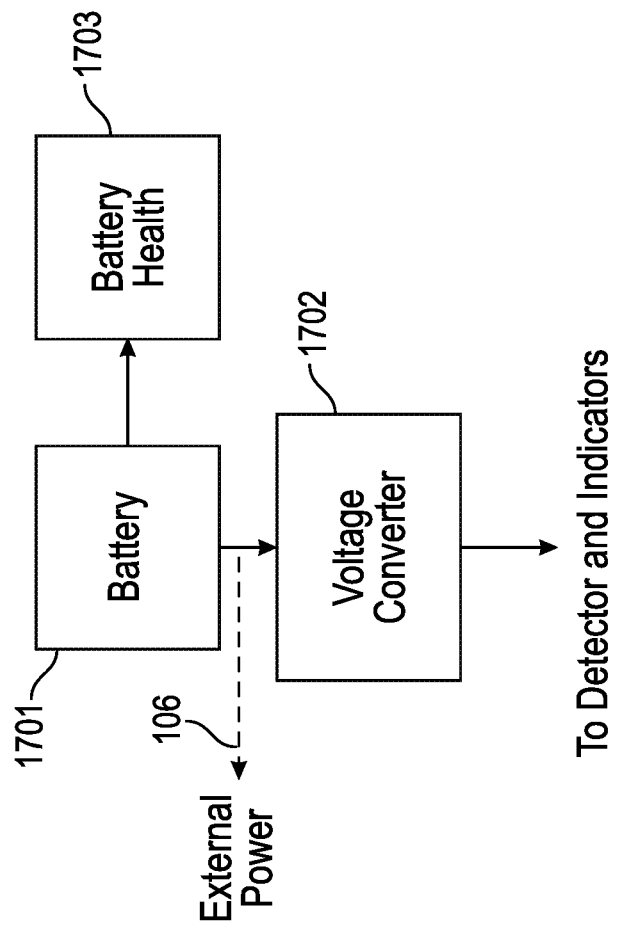
FIG. 17 illustrates a simplified schematic diagram of a non-rechargeable dc power module, according to an embodiment.

FIG. 17 illustrates a simplified block diagram of a non-rechargeable dc power module, according to an embodiment. The non-rechargeable dc power module may comprise a battery 1701, battery health module 1703, and voltage converter 1702. The battery 1701 acts as the source of electrical current for the device, and the voltage converter 1702 converts the voltage from the battery to the voltage level required by the detector 103 and indicators 104. The voltage converter 1702 may be excluded when voltage conversion is not necessary. The battery health module 1703 monitors the battery status, providing visible, audible, or electrical signal indication of when the battery is near discharge.

Figure 18:
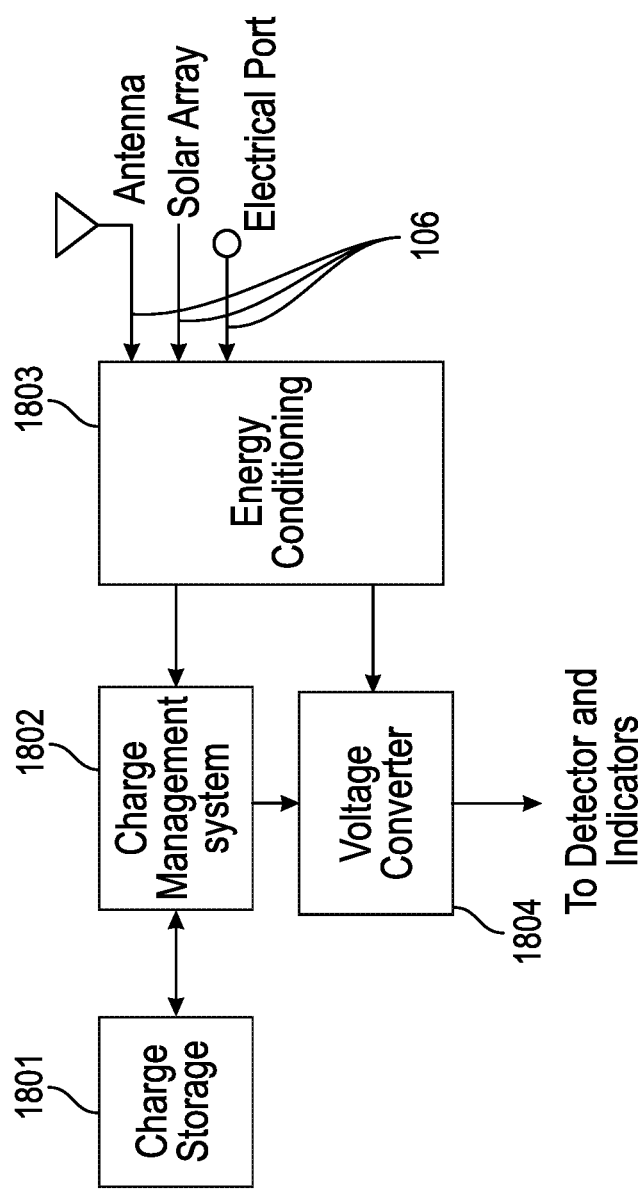
FIG. 18 illustrates a simplified schematic diagram of a rechargeable dc power module, according to an embodiment.

FIG. 18 illustrates a simplified schematic diagram of a rechargeable dc power module, according to an embodiment. The rechargeable dc power module may comprise a charge storage element 1801, charge management system 1802, voltage converter 1804, energy conditioning module 1803, and external power source 106. The charge storage element may comprise, but is not limited to, a rechargeable battery, a capacitor, or a supercapacitor. The charge storage element 1801 acts as a source of electrical current to the detector 103 and indicators 104. The voltage converter 1804 converts the voltage from the charge storage element 1801 to the voltage level required by the detector 103 and indicators 104. The external power source 106 is used to recharge the charge storage element 1801. Additionally, the external power source 106 can be used to provide power directly to the voltage converter 1804, detector 103, and indicators 104. The external power source 106 may comprise, but is not limited to, an antenna, a solar array, or a dc electrical port. The charge management system 1802 controls the flow of current into and out of the charge storage element 1801. Additionally, the charge management system 1802 controls the flow of current to the voltage converter 1804, detector 103, and indicators 104. The charge management system 1802 also monitors the charge storage element 1801 status, providing visible, audible, or electrical signal indication of when the element is near discharge. The voltage converter 1804 is used to convert the charge storage element 1801 voltage to the voltage required by the detector 103 and indicators 104. The voltage converter 1804 may be excluded when voltage conversion is not required.

Figure 19:
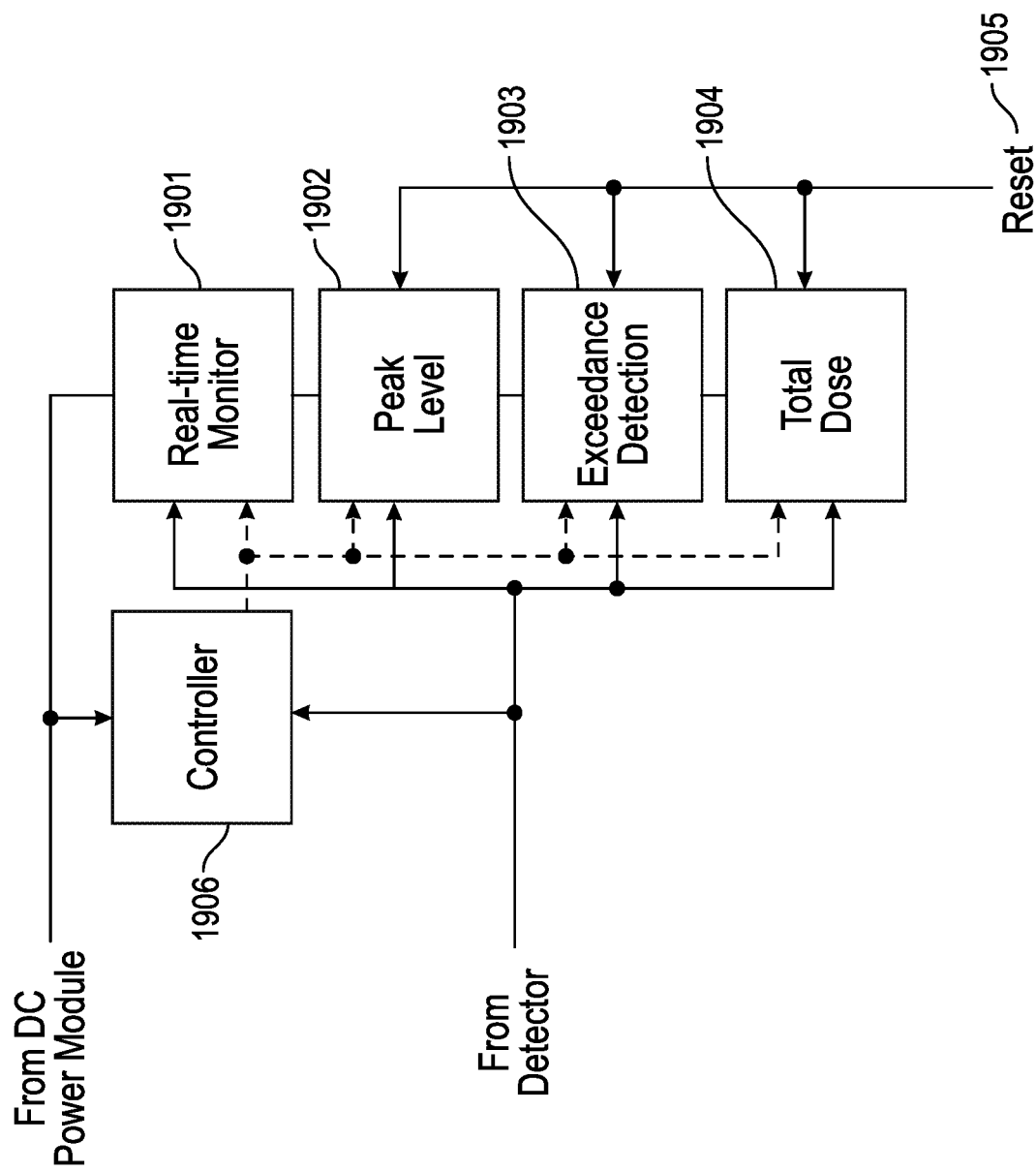
FIG. 19 is a block diagram illustrating example physical components of an indicator module, according to an embodiment.

FIG. 19 is a block diagram illustrating example physical components of an indicator module 104, according to an embodiment. The indicator module 104 may comprise a controller 1906 and a plurality of indicators. Indicators may include, but are not limited to, real-time electromagnetic field strength indicators 1901 (e.g., the indicator continuously indicates the current electromagnetic field strength), peak electromagnetic field strength indicators 1902 (e.g., the indicator indicates the highest electromagnetic field strength detected since the device was last reset), electromagnetic field exceedance indicators 1903 (e.g., the indicator will activate once a predetermined strength of electromagnetic field is detected), and cumulative electromagnetic field dose indicators 1904 (e.g., the indicator becomes increasingly active based on cumulative electromagnetic field dosage received and/or the indicator displays, in quantifiable terms, the cumulative electromagnetic field dosage received). In the case of peak strength, exceedance detection, and cumulative total dose monitoring, an external reset signal 1905 may be used to reset the indicators.

According to an embodiment, the indicator module 104 may further comprise a controller 1906. The controller 1906 may be configured to control the operation of indicators. The controller 1906 may be used in any embodiment of the electromagnetic field detection device where the complexity of the indicators or the complexity of the indicator arrangement requires additional control. The controller 1906 may be powered by the dc power module 105.

According to an embodiment, the controller 1906 is comprised of a processor and memory. According to another embodiment, the controller 1906 is comprised of a microcontroller with internal or external memory. According to another embodiment, the controller is comprised of a field-programmable gate array (FPGA). According to another embodiment, the controller is comprised of a set of discrete logical gates.

The processor, microcontroller, FPGA, or logical gates execute commands to perform the functions specified throughout this disclosure.

Memory may include various types of short and long-term memory as is known in the art. Memory may be loaded with various applications and/or instructions in the form of as computer readable program instructions that, when executed by the processor, control the operation of the indicators. These computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Figure 20:
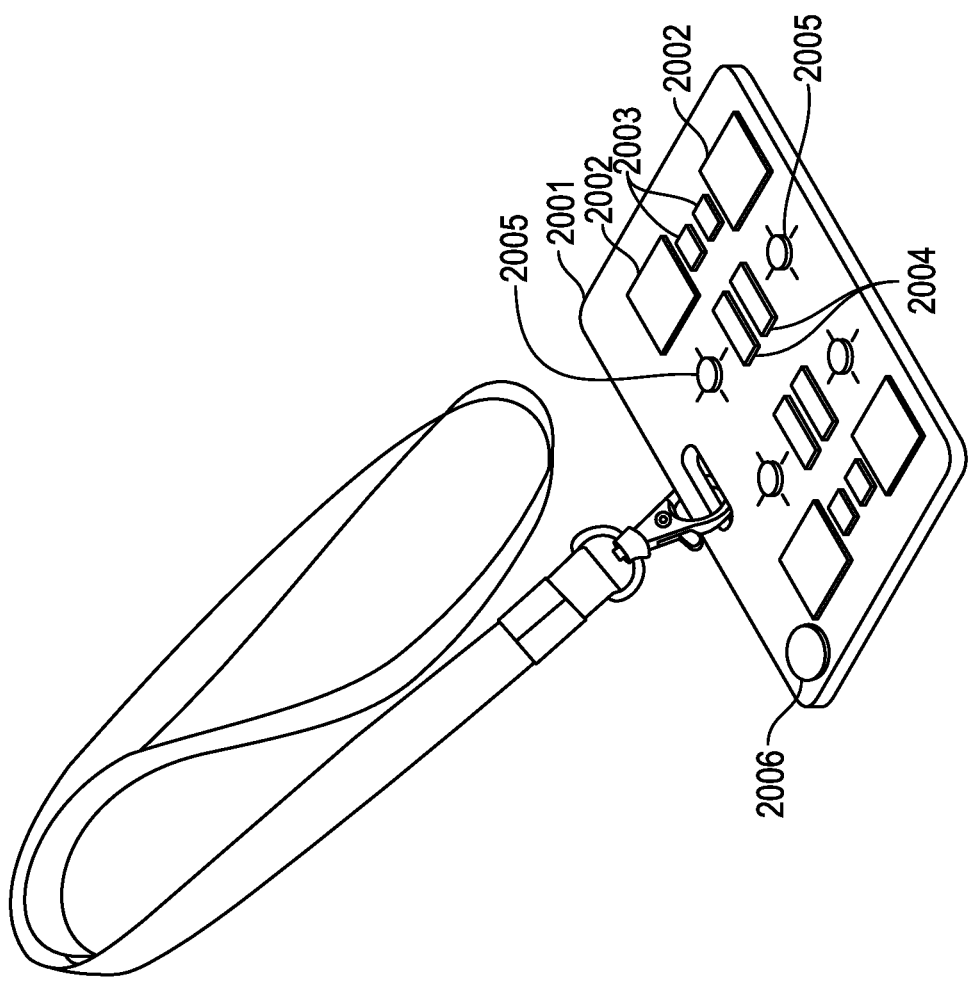
FIG. 20 illustrates an electromagnetic field detection device integrated into a lanyard identification card, according to an embodiment.

FIG. 20 illustrates an electromagnetic field detection device integrated into a lanyard identification card 2001, according to an embodiment. The antennas 2002, matching network 2003, detectors 2004, dc power module 2006, and indicators 2005 are constructed on a circuit board assembly which is either attached to, or integrated into, the lanyard card. In the illustrated embodiment, four electromagnetic monitoring channels are present, but any number are possible.

Figure 21:
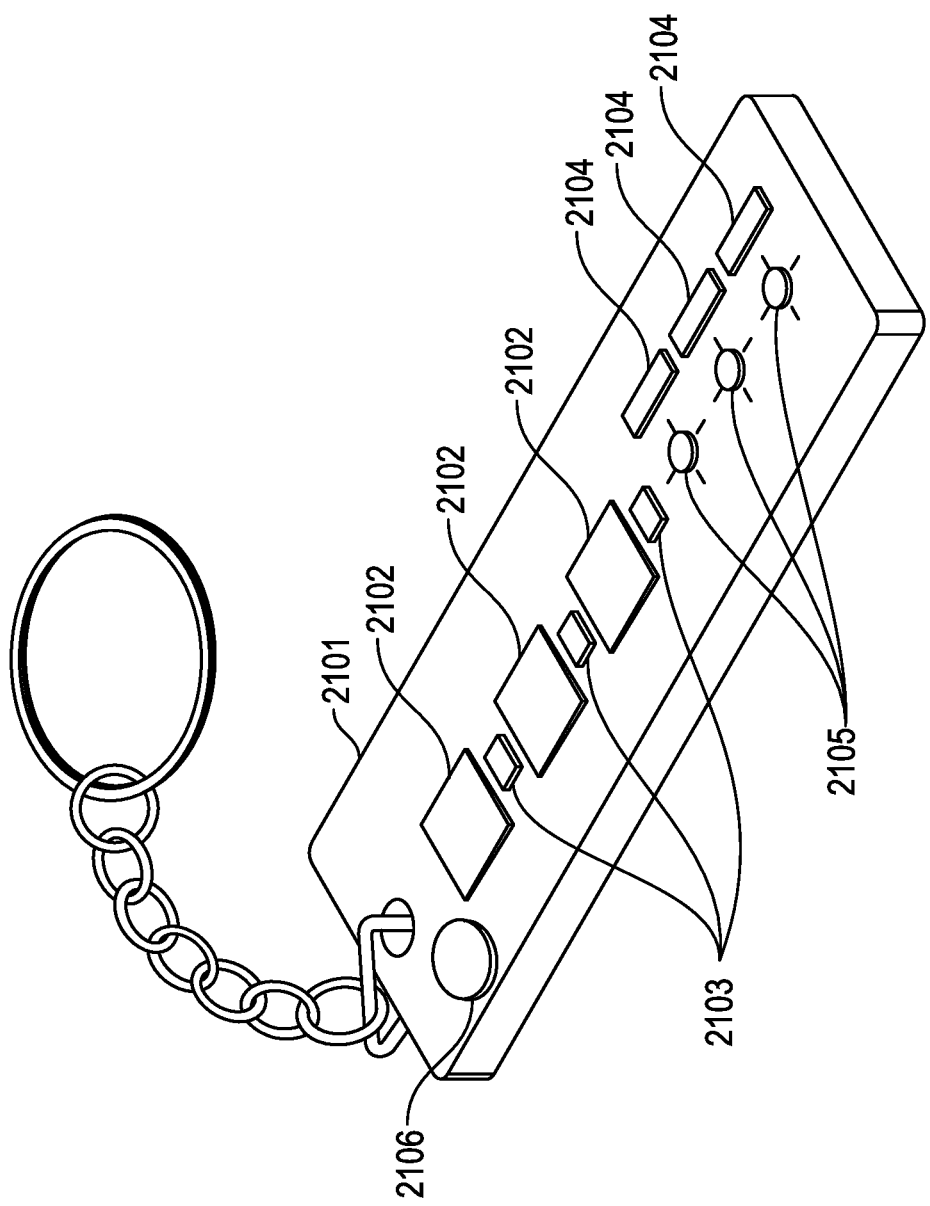
FIG. 21 illustrates an electromagnetic field detection device integrated into a keychain, according to an embodiment.

FIG. 21 illustrates an electromagnetic field detection device integrated into a keychain 2101, according to an embodiment. The antennas 2102, matching networks 2103, detectors 2104, dc power module 2106, and indicators 2105 are constructed on a circuit board assembly that is either attached to, or integrated into, the keychain attachment. In the illustrated embodiment, three electromagnetic monitoring channels are present, but any number are possible.

Figure 22:
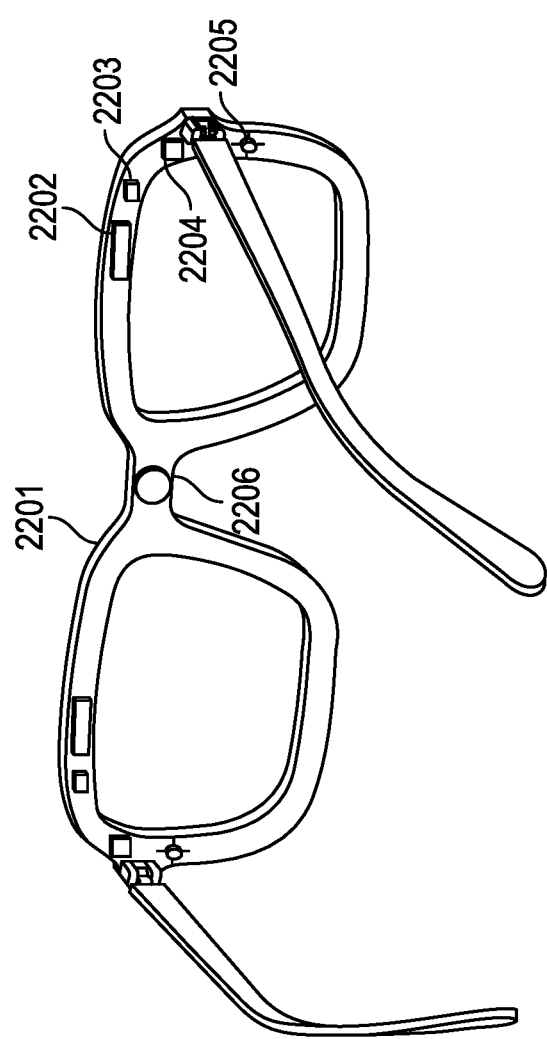
FIG. 22 illustrates an electromagnetic field detection device integrated into a frame of eyeglasses, according to an embodiment.

FIG. 22 illustrates an electromagnetic field detection device integrated into a frame of eyeglasses 2201, according to an embodiment. The antennas 2202, matching networks 2203, detectors 2204, dc power module 2206, and indicators 2205 are constructed on a circuit board assembly that is attached to, or integrated into, the eyeglasses frame. In the illustrated embodiment, two electromagnetic monitoring channels are present, but any number are possible.

Figure 23:
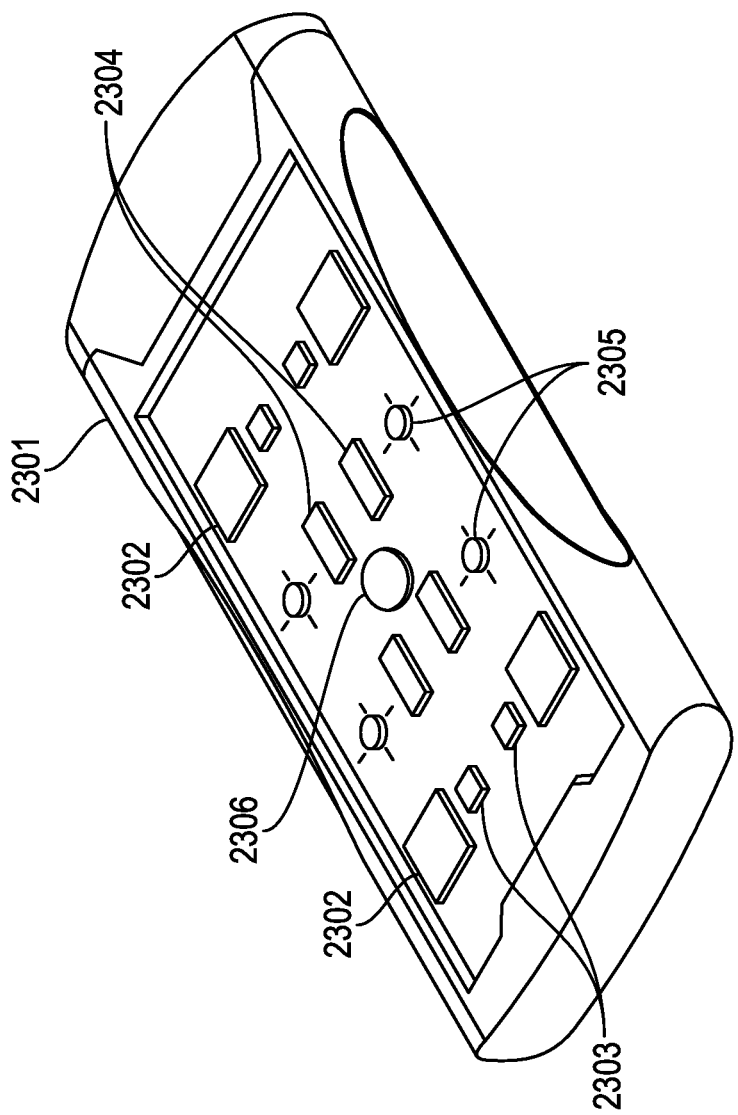
FIG. 23 illustrates an electromagnetic field detection device integrated into a handheld instrument, according to an embodiment.

FIG. 23 illustrates an electromagnetic field detection device integrated into a handheld instrument 2301, according to an embodiment. The antennas 2302, matching networks 2303, detectors 2304, dc power module 2306, and indicators 2305 are constructed on a circuit board assembly that is attached to, or integrated into, a handheld electronics housing. In the illustrated embodiment, four electromagnetic monitoring channels are present, but any number are possible.

Figure 24:
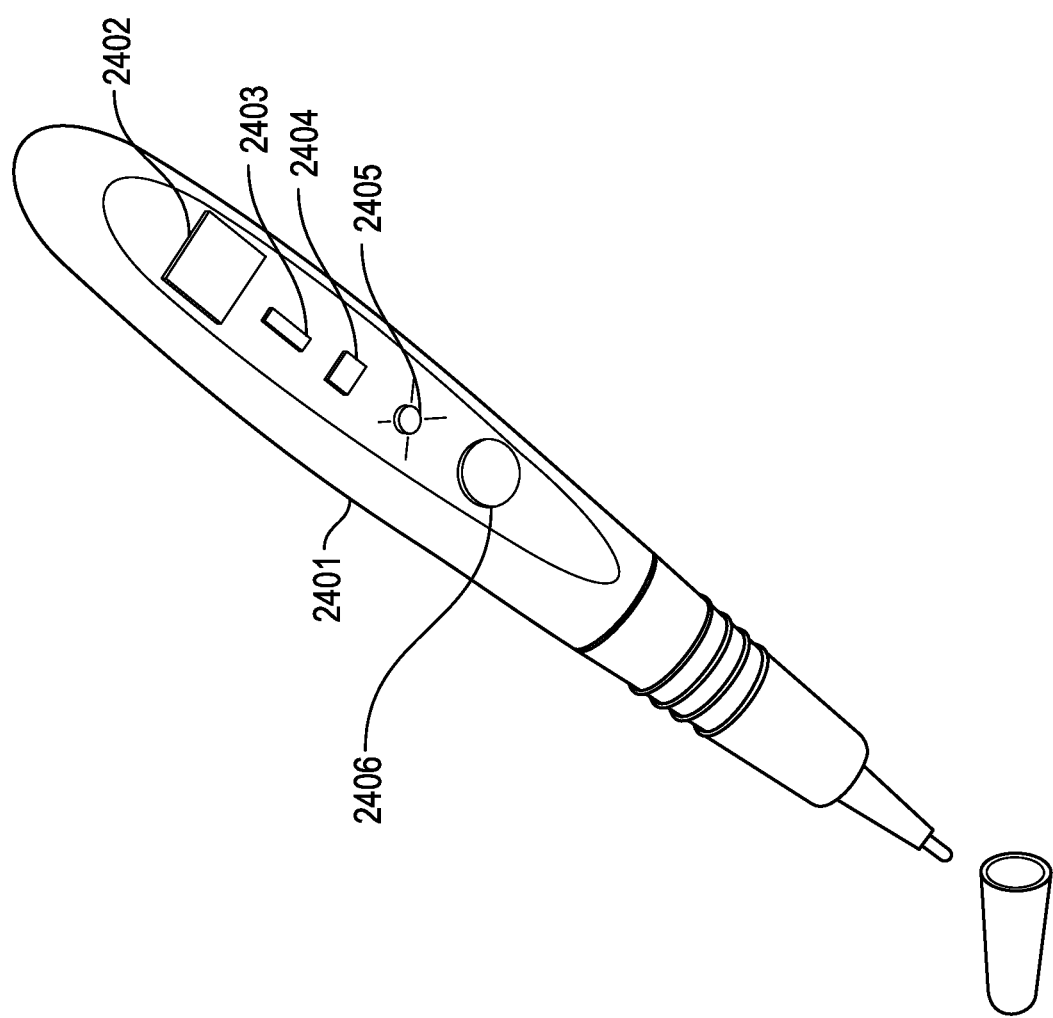
FIG. 24 illustrates an electromagnetic field detection device integrated into a writing instrument, according to an embodiment.

FIG. 24 illustrates an electromagnetic field detection device integrated into a writing instrument 2401, according to an embodiment. The antenna 2402, matching network 2403, detector 2404, dc power module 2406, and indicator 2405 are constructed on a circuit board assembly which is either attached to, or integrated into, the writing instrument. In the illustrated embodiment, one electromagnetic monitoring channel is present, but any number are possible.

Figure 25:
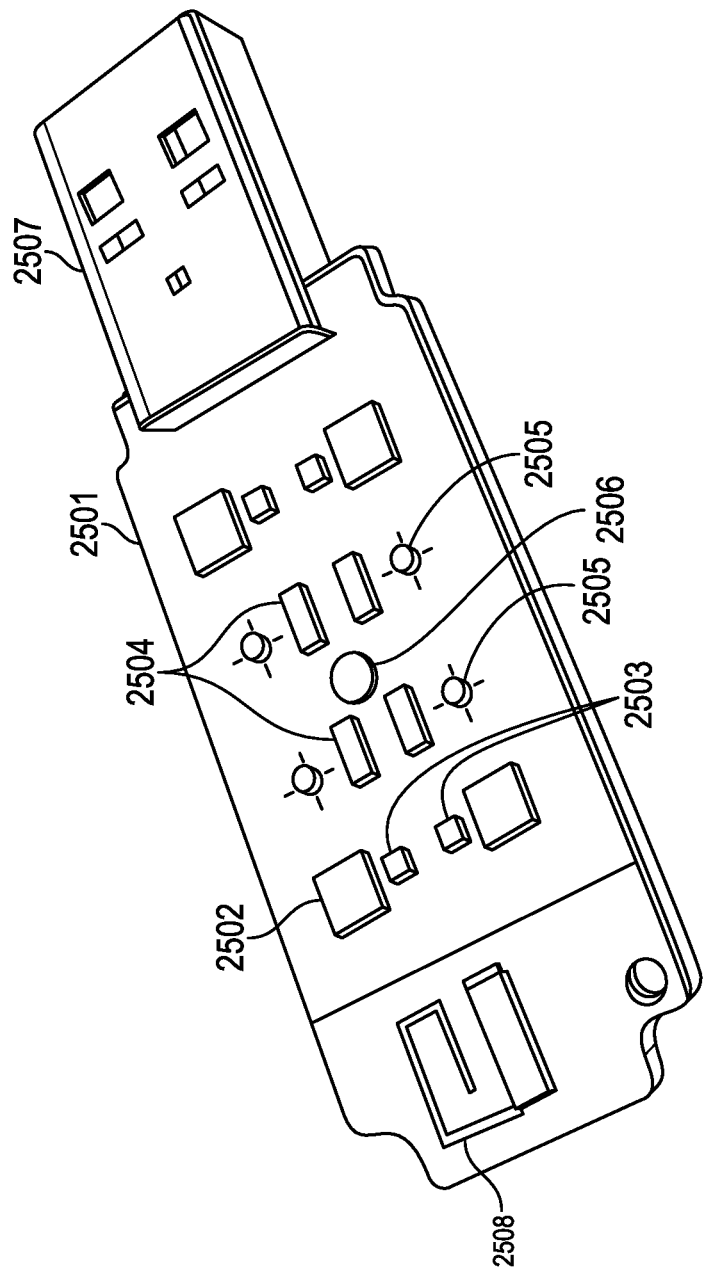
FIG. 25 illustrates an electromagnetic field detection device integrated into a Universal Serial Bus (USB) dongle equipped with onboard antenna, according to an embodiment.

FIG. 25 illustrates an electromagnetic field detection device integrated into a USB dongle 2501, according to an embodiment. The onboard antenna 2502, matching network 2503, detector 2504, dc power module 2506, indicator 2505, and external power port 2507 are constructed on a circuit board assembly which is integrated into the dongle. In the illustrated embodiment, four electromagnetic monitoring channels are present, but any number are possible.

Figure 26:
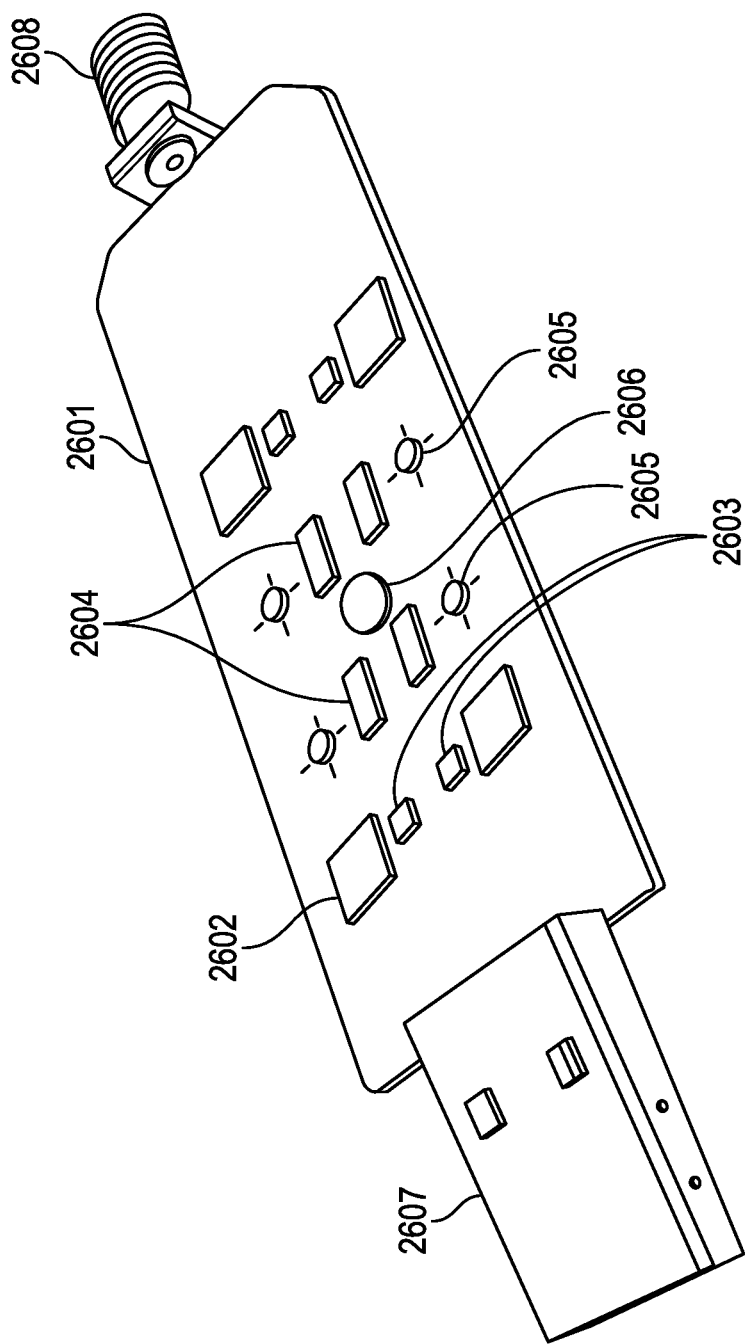
FIG. 26 illustrates an electromagnetic field detection device integrated into a Universal Serial Bus (USB) dongle equipped with offboard antenna, according to an embodiment.

FIG. 26 illustrates an electromagnetic field detection device integrated into a USB dongle 2601, according to an embodiment. The matching network 2603, detector 2604, dc power module 2606, indicator 2605, and external power port 2607 are constructed on a circuit board assembly which is integrated into the dongle. The offboard antenna connection 2602 allows for the attachment of a variety of antennas. In the illustrated embodiment, four electromagnetic monitoring channels are present, but any number are possible.

The electromagnetic field detection devices of this disclosure embody a significant advance over existing electromagnetic field detection devices that lack the ease-of-use and adaptability of the present invention.

The present invention does not require user activation. Rather, the device is autonomous, automatically warning the user when in the presence of potentially damaging microwave, millimeter wave, or electromagnetic pulse energy.

The present invention can operate in at least one of three different power arrangements: using an external dc power source, such as a USB port on a laptop, using its own internal power source, such as a battery or supercapacitor, and using energy harvesting. If rechargeable, the device can be recharged by a wired connection to an external dc power source, such as a USB port, or by harvesting energy from otherwise wasted energy, such as that from solar, thermal, wind, movement, or electromagnetic fields. In either case, the detection device benefits from the use of ultra low power components enabling continuous operation without the need for frequent battery replacement or charging.

I claim:

1. An electromagnetic weapon event detection device to monitor electromagnetic fields harmful to humans comprising:
    a portable housing;
    an antenna configured to capture energy from electromagnetic fields with frequencies between 1 GHz and 300 GHz;
    a matching network coupled to the antenna and configured to match the output characteristics of the antenna with the input characteristics of the accumulated peak level detector;
    an accumulated peak level detector operatively coupled to the matching network and configured to detect electromagnetic fields with frequencies between 1 GHz and 300 GHz, wherein the accumulated peak level detector detects electromagnetic fields with power densities of at least 10,000 watts per square meter harmful to humans;
    at least one indicator operatively coupled to an output of the accumulated peak level detector; and
    a dc power module operatively coupled to the accumulated peak level detector and indicators.

2. The electromagnetic weapon event detection device of claim 1, wherein the accumulated peak level detector comprises a sample and hold.

3. The electromagnetic weapon event detection device of claim 1, wherein the indicator is at least one of an audible alarm, a visual alarm, a tactile alarm, and an electrical signal.

4. The electromagnetic weapon event detection device of claim 3, wherein the indicator specifies at least one of real-time electromagnetic field strength, peak electromagnetic field strength in a time period, electromagnetic field exceedance, and cumulative electromagnetic field dose.

5. The electromagnetic weapon event detection device of claim 1, wherein the dc power module contains a non-rechargeable battery as its only power source.

6. The electromagnetic weapon event detection device of claim 5, wherein the dc power module contains an electrical interface by which to attach an external dc power source.

7. The electromagnetic weapon event detection device of claim 1, wherein the dc power module contains at least one of a capacitor, a supercapacitor, and a rechargeable battery.

8. The electromagnetic weapon event detection device of claim 7, further comprising energy harvesting circuitry operatively coupled to the dc power module wherein the energy harvested is one of electromagnetic energy, thermal energy, wind energy, and solar energy.

9. The electromagnetic weapon event detection device of claim 1, wherein the device consumes less than ten milliwatts of average total power.

10. The electromagnetic weapon event detection device of claim 1,
    wherein the antenna is configured to capture energy from electromagnetic fields with frequencies in a range between 30 GHz and 300 GHz; and
    wherein the accumulated peak level detector is configured to detect electromagnetic fields with frequencies in the range captured by the antenna.

11. The electromagnetic weapon event detection device of claim 1,
wherein the accumulated peak level detector comprises a capacitor to accumulate voltage until a voltage level peaks to a power density level harmful to humans of at least 10,000 watts per square meter.

\* \* \* \* \*